(12) United States Patent
Matsui

(10) Patent No.: US 11,394,310 B2
(45) Date of Patent: Jul. 19, 2022

(54) POWER CONVERSION DEVICE

(71) Applicant: FUJI ELECTRIC CO., LTD., Kawasaki (JP)

(72) Inventor: Kohei Matsui, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 123 days.

(21) Appl. No.: 16/895,195

(22) Filed: Jun. 8, 2020

(65) Prior Publication Data

US 2021/0028714 A1 Jan. 28, 2021

(30) Foreign Application Priority Data

Jul. 25, 2019 (JP) .............................. JP2019-136754

(51) Int. Cl.
*H02M 5/293* (2006.01)
*B60L 50/53* (2019.01)
*B60L 5/20* (2006.01)
*B61C 3/00* (2006.01)

(52) U.S. Cl.
CPC ............... *H02M 5/293* (2013.01); *B60L 5/20* (2013.01); *B60L 50/53* (2019.02); *B60L 2200/26* (2013.01); *B61C 3/00* (2013.01)

(58) Field of Classification Search
CPC .......... H02M 5/293; B60L 50/53; B60L 5/20; B60L 2200/26; B61C 3/00
USPC .......................................................... 307/9.1
See application file for complete search history.

(56) References Cited

U.S. PATENT DOCUMENTS

| | | |
|---|---|---|
| 5,101,244 A | 3/1992 | Mori et al. |
| 5,166,760 A | 11/1992 | Mori et al. |
| 5,274,541 A | 12/1993 | Kimura et al. |
| 5,278,443 A | 1/1994 | Mori et al. |
| 5,459,655 A | 10/1995 | Mori et al. |
| 5,731,970 A | 3/1998 | Mori et al. |
| 5,801,936 A | 9/1998 | Mori et al. |
| 5,929,519 A | 7/1999 | Mori et al. |
| 6,259,616 B1 | 7/2001 | Ekwall et al. |
| 2009/0219696 A1* | 9/2009 | Nakayama ............ H02M 7/003 361/709 |
| 2012/0092915 A1* | 4/2012 | Okuda ................... H02M 7/487 363/132 |
| 2014/0111959 A1* | 4/2014 | Li .......................... H02M 7/487 174/68.2 |

(Continued)

FOREIGN PATENT DOCUMENTS

| | | |
|---|---|---|
| CN | 204103780 U | 1/2015 |
| JP | H05-083947 A | 4/1993 |
| JP | H08-294266 A | 11/1996 |

(Continued)

OTHER PUBLICATIONS

European Search Report, "EP Application No. 20176404.0," Search Report dated Oct. 19, 2020.

*Primary Examiner* — Rexford N Barnie
*Assistant Examiner* — Swarna N Chowdhuri
(74) *Attorney, Agent, or Firm* — Manabu Kanesaka

(57) ABSTRACT

In a power conversion device, a distance between an output terminal of a first switching module and a cathode terminal of a first diode module in a first direction is arranged to be substantially equal to a distance between an output terminal of a second switching module and an anode terminal of a second diode module in the first direction.

12 Claims, 20 Drawing Sheets

[FIRST EMBODIMENT]

(56) References Cited

U.S. PATENT DOCUMENTS

2015/0236609 A1* 8/2015 Kato ..................... H02M 7/46
363/78

FOREIGN PATENT DOCUMENTS

| JP | H11-089249 A | 3/1999 |
|---|---|---|
| WO | 2018/163606 A1 | 9/2018 |

* cited by examiner

[FIRST EMBODIMENT]

FIG.2 [FIRST EMBODIMENT]

[FIRST EMBODIMENT]

[FIRST EMBODIMENT]

[FIRST EMBODIMENT]

FIG.11 [FIRST EMBODIMENT]
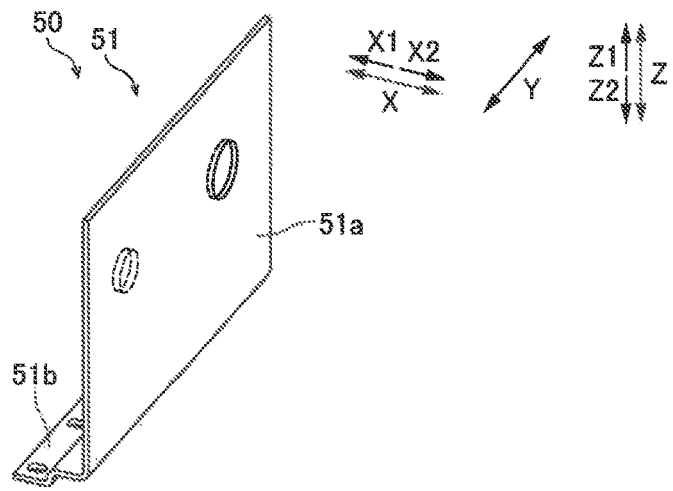
FIG.12 [FIRST EMBODIMENT]
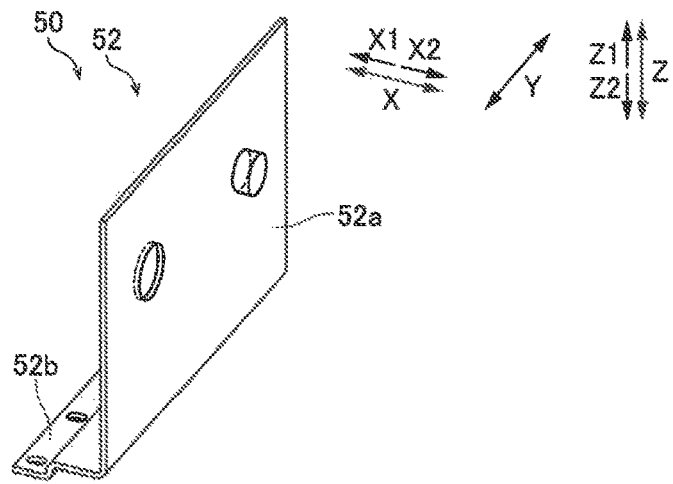
FIG.13 [FIRST EMBODIMENT]
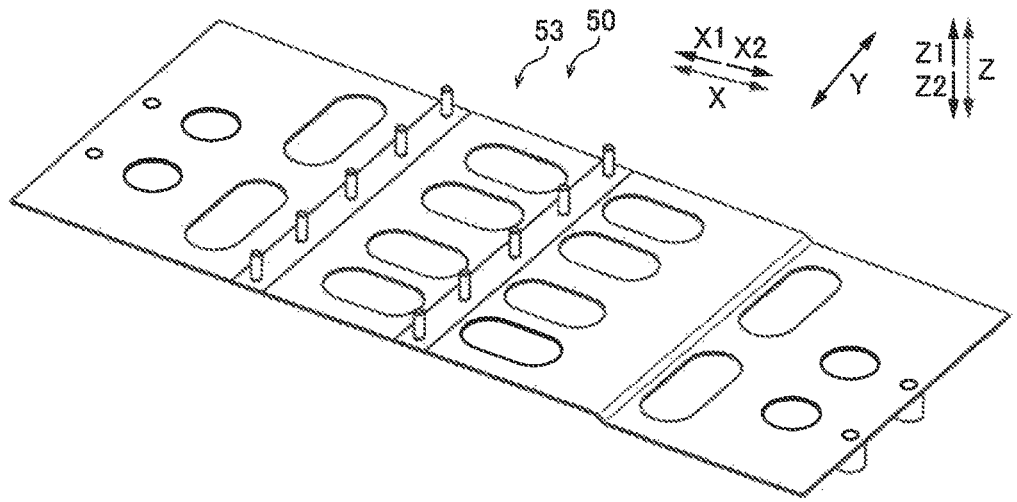

[THIRD EMBODIMENT]

FIG.21 [FOURTH EMBODIMENT]

FIG.23

[FIRST MODIFIED EXAMPLE]

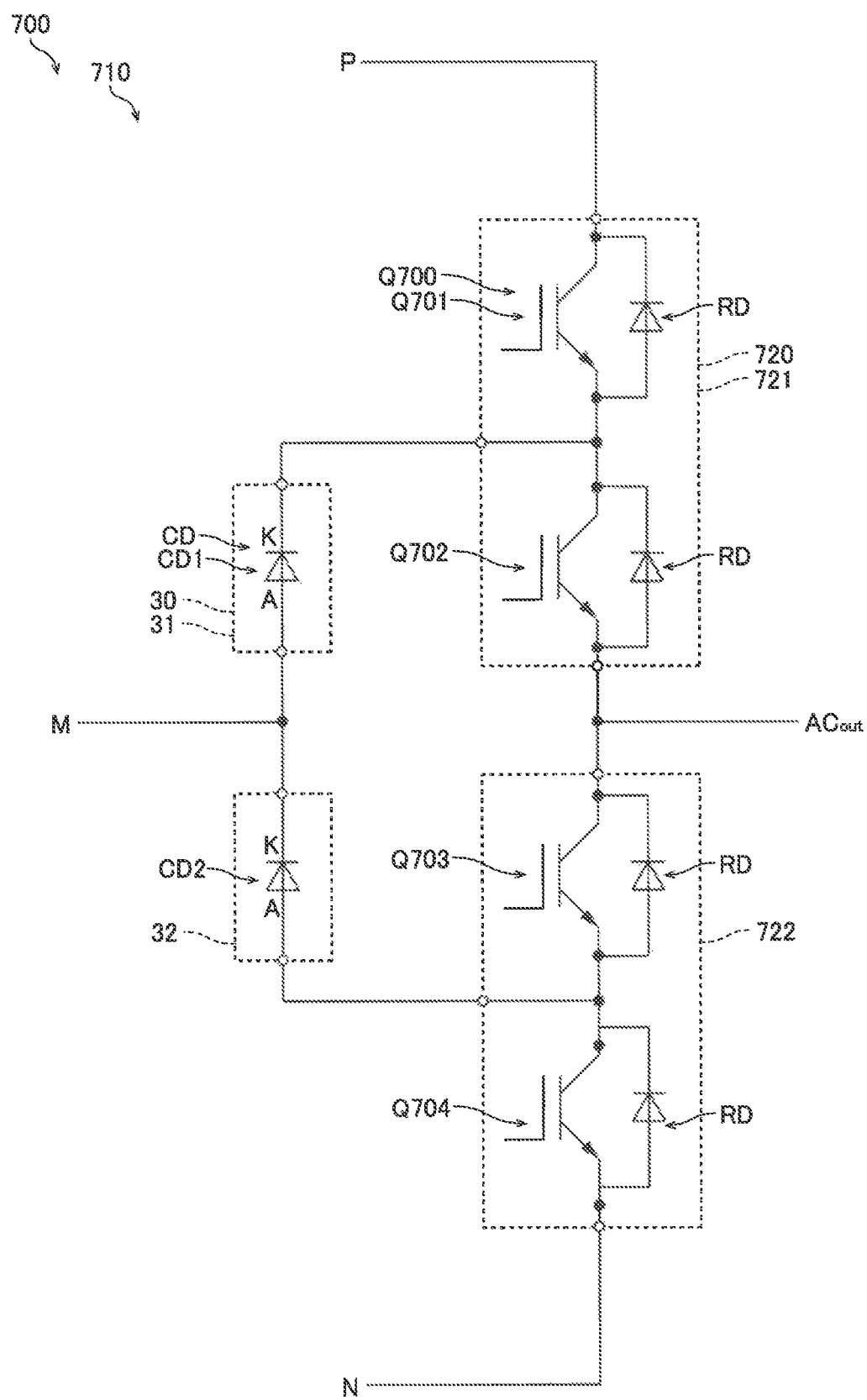
FIG.26 [SECOND MODIFIED EXAMPLE]

POWER CONVERSION DEVICE

CROSS-REFERENCE TO RELATED APPLICATION

The present application claims priority of Japanese Patent Application No. 2019-136754 filed Jul. 25, 2019, the disclosure of which is hereby incorporated by reference.

BACKGROUND OF THE INVENTION

Field of the Invention

The present invention relates to a power conversion device, and more particularly, it relates to a power conversion device configured to output power of three levels of potentials.

Description of the Background Art

A power conversion device configured to output power of three levels of potentials is known in general, as disclosed in Japanese Patent Laid-Open No. 5-083947, for example.

Japanese Patent Laid-Open No. 5-083947 discloses a power conversion device configured to output power of three levels of potentials, an upper potential, an intermediate potential, and a lower potential. The power conversion device disclosed in Japanese Patent Laid-Open No. 5-083947 includes a first switching element, a second switching element, a third switching element, and a fourth switching element connected in series with each other in this order from an upper potential side toward a lower potential side. Diodes as freewheeling diodes are respectively connected in anti-parallel to the first switching element, the second switching element, the third switching element, and the fourth switching element. That is, the switching element and the diode are configured as an element pair. In addition, the power conversion device disclosed in Japanese Patent Laid-Open No. 5-083947 includes a first clamp diode connected to a connection point between the first switching element and the second switching element, and a second clamp diode connected to a connection point between the third switching element and the fourth switching element. The first clamp diode and the second clamp diode are connected in series with each other. The connection point between the first clamp diode and the second clamp diode is connected to an intermediate potential point. In the power conversion device disclosed in Japanese Patent Laid-Open No. 5-083947, the four switching elements and the two clamp diodes are combined such that the power of three levels of potentials is output (as a three-level circuit).

In the power conversion device disclosed in Japanese Patent Laid-Open No. 5-083947, the element pair of the switching element and the diode is configured as one module. In other words, the power conversion device disclosed in Japanese Patent Laid-Open No. 5-083947 includes an upper potential module in which the first switching element and the second switching element are incorporated and a lower potential module in which the third switching element and the fourth switching element are incorporated. In each of the upper potential module and the lower potential module, a positive-side terminal, a negative-side terminal, and an output terminal are aligned in this order along the longitudinal direction of the module. The positive-side terminal of the upper potential module is connected to an upper potential point. The negative-side terminal of the lower potential module is connected to a lower potential point. The output terminal of the upper potential module is connected to a cathode of the first clamp diode. The output terminal of the lower potential module is connected to an anode of the second clamp diode.

Although not disclosed in Japanese Patent Laid-Open No. 5-083947, in a conventional power conversion device as disclosed in Japanese Patent Laid-Open No. 5-083947, two diodes incorporated in modules similar to the upper potential module and the lower potential module are generally used as two clamp diodes. That is, the conventional power conversion device as disclosed in Japanese Patent Laid-Open No. 5-083947 has a configuration (hereinafter referred to as a configuration A) including an intermediate potential module including a positive-side terminal connected to an output terminal of an upper potential module (arranged on the cathode side of a first clamp diode), a negative-side terminal connected to an output terminal of a lower potential module (arranged on the anode side of a second clamp diode), and an output terminal connected to an intermediate potential point in addition to the upper potential module and the lower potential module. In the configuration A, it is desired to reduce a difference between the length of a wire that connects the output terminal of the upper potential module to the positive-side terminal of the intermediate potential module and the length of a wire that connects the output terminal of the lower potential module to the negative-side terminal of the intermediate potential module in order to make the surge voltage duty imposed on symmetric switching elements on an electric circuit substantially equal between the upper potential side and the lower potential side (make the surge voltage duty imposed on a first switching element and the surge voltage duty imposed on a fourth switching element substantially equal to each other, and make the surge voltage duty imposed on a second switching element and the surge voltage duty imposed on the fourth switching element substantially equal to each other).

However, in the configuration A, the terminal (the positive-side terminal of the intermediate potential module) to which the output terminal of the upper potential module is connected and the terminal (the negative-side terminal of the intermediate potential module) to which the output terminal of the lower potential module is connected are provided in one module (intermediate potential module). In this case, in order to make the length of the wire that connects the output terminal of the upper potential module to the positive-side terminal of the intermediate potential module and the length of the wire that connects the output terminal of the lower potential module to the negative-side terminal of the intermediate potential module substantially equal to each other, the degree of freedom in arranging the upper potential module, the intermediate potential module, and the lower potential module is conceivably reduced. Therefore, in the power conversion device disclosed in Japanese Patent Laid-Open No. 5-083947, the degree of freedom in arranging the modules may be disadvantageously reduced in order to make the surge voltage duty imposed on the symmetric switching elements on the electric circuit substantially equal between the upper potential side and the lower potential side in the three-level circuit.

SUMMARY OF THE INVENTION

The present invention has been proposed in order to solve the aforementioned problem, and an object of the present invention is to provide a power conversion device capable of making the surge voltage duty imposed on symmetric switching elements on an electric circuit substantially equal between the upper potential side and the lower potential side while significantly reducing or preventing a reduction in the degree of freedom in arranging modules in a three-level circuit.

In order to attain the aforementioned object, a power conversion device according to an aspect of the present invention is configured to output power of three levels of potentials including an upper potential, an intermediate potential, and a lower potential, and the power conversion device includes a switching module including two semiconductor switching elements and including a positive-side terminal, a negative-side terminal, and an output terminal aligned in a first direction, and a diode module including a diode and including an anode terminal and a cathode terminal aligned in the first direction. The switching module includes a first switching module including the positive-side terminal as an upper potential terminal, the negative-side terminal, and the output terminal, and a second switching module including the negative-side terminal as a lower potential terminal, the positive-side terminal, and the output terminal, the diode module includes a first diode module including the cathode terminal connected to the output terminal of the first switching module and the anode terminal as an intermediate potential terminal, and a second diode module including the anode terminal connected to the output terminal of the second switching module and the cathode terminal as an intermediate potential terminal, and a distance between the output terminal of the first switching module and the cathode terminal of the first diode module in the first direction is substantially equal to a distance between the output terminal of the second switching module and the anode terminal of the second diode module in the first direction.

In the power conversion device according to this aspect of the present invention, as described above, the distance between the output terminal of the first switching module and the cathode terminal of the first diode module in the first direction is substantially equal to the distance between the output terminal of the second switching module and the anode terminal of the second diode module in the first direction. Accordingly, when the first switching module, the second switching module, the first diode module, and the second diode module are aligned in the first direction, for example, the length of a wire that connects the output terminal of the first switching module to the cathode terminal of the first diode module can easily be substantially equal to the length of a wire that connects the output terminal of the second switching module to the anode terminal of the second diode module. Furthermore, in the power conversion device according to this aspect, the first diode module and the second diode module are separately provided. Accordingly, unlike the case in which the diode connected to the output terminal of the first switching module and the diode connected to the output terminal of the second switching module are incorporated in one module, the terminal (the cathode terminal of the first diode module) to which the output terminal of the first switching module is connected, and the terminal (the anode terminal of the second diode module) to which the output terminal of the second switching module is connected can be individually arranged. Therefore, regardless of the arrangement positions of the first switching module and the second switching module, the distance between the output terminal of the first switching module and the cathode terminal of the first diode module in the first direction can easily (i.e., while a reduction in the degree of freedom in arranging the modules is significantly reduced or prevented) be substantially equal to the distance between the output terminal of the second switching module and the anode terminal of the second diode module in the first direction. Consequently, in a three-level circuit, the circuit inductance that exists in commutation circuits of the switching elements can be substantially equal between the upper potential side and the lower potential side while a reduction in the degree of freedom in arranging the modules is significantly reduced or prevented. That is, in the three-level circuit, the surge voltage duty imposed on the symmetric switching elements on an electric circuit can be substantially equal between the upper potential side and the lower potential side while a reduction in the degree of freedom in arranging the modules is significantly reduced or prevented.

In the aforementioned power conversion device according to this aspect, the output terminal of the first switching module and the output terminal of the second switching module are preferably arranged in such a manner as to be substantially symmetric with respect to a centerline along a second direction orthogonal to the first direction, and the cathode terminal of the first diode module and the anode terminal of the second diode module are preferably arranged in such a manner as to be substantially symmetric with respect to the centerline. According to this configuration, a distance from the centerline to the output terminal of the first switching module on a first side in the first direction can be substantially equal to a distance from the centerline to the output terminal of the second switching module on a second side in the first direction. Furthermore, a distance from the centerline to the cathode terminal of the first diode module on the first side can be substantially equal to a distance from the centerline to the anode terminal of the second diode module on the second side. Consequently, the configuration in which the distance between the output terminal of the first switching module and the cathode terminal of the first diode module in the first direction is substantially equal to the distance between the output terminal of the second switching module and the anode terminal of the second diode module in the first direction can be easily achieved.

In this case, the positive-side terminal, the negative-side terminal, and the output terminal of the first switching module and the positive-side terminal, the negative-side terminal, and the output terminal of the second switching module are preferably arranged in such a manner as to be substantially symmetric with respect to the centerline, and the cathode terminal and the anode terminal of the first diode module and the anode terminal and the cathode terminal of the second diode module are preferably arranged in such a manner as to be substantially symmetric with respect to the centerline. According to this configuration, the configuration in which the output terminal of the first switching module and the output terminal of the second switching module are arranged in such a manner as to be substantially symmetric with respect to the centerline can be easily achieved by using, as the first switching module and the second switching module, the switching modules in which the arrangements of the positive-side terminals, the negative-side terminals, and the output terminals are substantially the same as each other. Furthermore, the configuration in which the cathode terminal of the first diode module and the anode terminal of the second diode module are arranged in such a manner as to be substantially symmetric with respect to the centerline can be easily achieved by using, as the first diode module and the second diode module, the diode modules in which the arrangements of the anode terminals and the cathode terminals are substantially the same as each other.

In the aforementioned configuration in which the output terminal of the first switching module and the output terminal of the second switching module are arranged in such a manner as to be substantially symmetric with respect to the centerline, the first switching module and the second switching module preferably include substantially a same package, and are preferably arranged in such a manner as to be substantially symmetric with respect to the centerline, and the first diode module and the second diode module preferably include substantially a same package, and are preferably arranged in such a manner as to be substantially symmetric with respect to the centerline. According to this configuration, the arrangement of the output terminal in the switching module is substantially the same between the first switching module and the second switching module, and thus the configuration in which the output terminal of the first switching module and the output terminal of the second switching module are arranged in such a manner as to be substantially symmetric with respect to the centerline can be easily achieved. Furthermore, the arrangement of the anode terminal and the cathode terminal in the diode module is substantially the same between the first diode module and the second diode module, and thus the configuration in which the cathode terminal of the first diode module and the anode terminal of the second diode module are arranged in such a manner as to be substantially symmetric with respect to the centerline can be easily achieved.

In the aforementioned configuration in which the output terminal of the first switching module and the output terminal of the second switching module are arranged in such a manner as to be substantially symmetric with respect to the centerline, each of the first switching module and the second switching module is preferably configured in such a manner that at least any two of the positive-side terminal, the negative-side terminal, and the output terminal are respectively arranged at its end on a first side in the first direction and its end on a second side in the first direction, and each of the first diode module and the second diode module is preferably configured in such a manner that the anode terminal and the cathode terminal are arranged in its central portion in the first direction. According to this configuration, in each of the first diode module and the second diode module, the anode terminal and the cathode terminal are arranged in the central portion in the first direction, and thus the anode terminal and the cathode terminal can be spaced apart from ends in the first direction. Consequently, when another module is arranged adjacent to the first diode module or the second diode module in the first direction, for example, an increase in the separation distance of the module due to ensuring of an insulation distance between terminals in the first direction can be significantly reduced or prevented.

In this case, the first diode module, the first switching module, the second switching module, and the second diode module are preferably aligned in this order in the first direction, and the first switching module and the second switching module are preferably spaced apart from each other in the first direction in such a manner that a shortest distance between one of the positive-side terminal, the negative-side terminal, and the output terminal of the first switching module and one of the positive-side terminal, the negative-side terminal, and the output terminal of the second switching module is equal to or longer than a predetermined insulation distance (determined in the device). According to this configuration, the dielectric strength between the terminal of the first switching module on the second switching module side and the terminal of the second switching module on the first switching module side can be effectively ensured.

The aforementioned configuration in which the output terminal of the first switching module and the output terminal of the second switching module are arranged in such a manner as to be substantially symmetric with respect to the centerline preferably further includes a first capacitor and a second capacitor connected in series with each other, a positive electrode potential conductor connected to a positive electrode terminal of the first capacitor and the positive-side terminal of the first switching module, a negative electrode potential conductor connected to a negative electrode terminal of the second capacitor and the negative-side terminal of the second switching module, and an intermediate potential conductor connected to the negative electrode terminal of the first capacitor, the positive electrode terminal of the second capacitor, the anode terminal of the first diode module, and the cathode terminal of the second diode module. Furthermore, the positive electrode potential conductor and the negative electrode potential conductor each preferably include a standing wall configured to extend in a third direction orthogonal to the first direction and the second direction, and the intermediate potential conductor preferably includes a first standing wall and a second standing wall configured to extend in the third direction in such a manner as to be adjacent to the standing wall of each of the positive electrode potential conductor and the negative electrode potential conductor. According to this configuration, the standing wall of the positive electrode potential conductor and the first standing wall of the intermediate potential conductor, through which currents flow in opposite directions, are adjacent to each other, and thus the inductance of each of the standing wall of the positive electrode potential conductor and the first standing wall of the intermediate potential conductor can be reduced. Furthermore, the standing wall of the negative electrode potential conductor and the second standing wall of the intermediate potential conductor, through which currents flow in opposite directions, are adjacent to each other, and thus the inductance of each of the standing wall of the negative electrode potential conductor and the second standing wall of the intermediate potential conductor can be reduced.

In this case, the positive electrode potential conductor and the negative electrode potential conductor each preferably further include a leg configured to extend in the first direction, and the intermediate potential conductor preferably further includes a leg configured to extend in the first direction in such a manner as to be adjacent in the third direction to the leg of each of the positive electrode potential conductor and the negative electrode potential conductor. According to this configuration, the terminals of the first switching module and the second switching module, in which the positive-side terminals, the negative-side terminals, and the output terminals are aligned in the first direction, can be easily connected to the terminals of the first diode module and the second diode module, in which the anode terminals and the cathode terminals are aligned in the first direction, by the leg of the positive electrode potential conductor, the leg of the negative electrode potential conductor, and the leg of the intermediate potential conductor, which are configured to extend in the first direction.

The aforementioned configuration in which the output terminal of the first switching module and the output terminal of the second switching module are arranged in such a manner as to be substantially symmetric with respect to the centerline preferably further includes an alternating current potential conductor connected to the negative-side terminal of the first switching module and the positive-side terminal of the second switching module, the alternating current potential conductor being configured to extend in the first direction, and the alternating current potential conductor preferably includes a bent portion that is bent in such a manner as to be spaced apart from a region in which a control board of at least one of the first switching module or the second switching module is arranged. According to this configuration, even when the alternating current potential conductor is arranged in the vicinity of the first switching module or the second switching module in such a manner as to extend in the first direction, the bent portion of the alternating current potential conductor is bent such that a space in which the control board is arranged can be easily ensured between the alternating current potential conductor and the first switching module or the second switching module can be easily ensured.

In the aforementioned configuration in which the output terminal of the first switching module and the output terminal of the second switching module are arranged in such a manner as to be substantially symmetric with respect to the centerline, a plurality of first switching modules is preferably connected in parallel to each other so as to be aligned in the second direction, and a plurality of second switching modules is preferably connected in parallel to each other so as to be aligned in the second direction. According to this configuration, the direction (second direction) in which the switching modules are connected in parallel is orthogonal to the direction (first direction) in which the positive-side terminal, the negative-side terminal, and the output terminal of the switching module are aligned, and the anode terminal and the cathode terminal of the diode module are aligned, and thus the power capacity of the power conversion device can be increased while the configuration in which the distance between the output terminal of the first switching module and the cathode terminal of the first diode module in the first direction is substantially equal to the distance between the output terminal of the second switching module, and the anode terminal of the second diode module in the first direction is maintained. Furthermore, when the first switching module and the second switching module are aligned in the first direction, the direction (first direction) in which the first switching module and the second switching module are aligned is orthogonal to the direction (second direction) in which the switching modules connected in parallel are aligned, and thus as compared with the case in which all the modules are aligned in one direction, an increase in the size of the power conversion device in one direction can be significantly reduced or prevented.

In the aforementioned power conversion device according to this aspect, the power conversion device is preferably a power conversion device mounted on a railroad vehicle, and the first switching module, the second switching module, the first diode module, and the second diode module are preferably aligned in the first direction, which is a traveling direction of the railroad vehicle. According to this configuration, the first switching module, the second switching module, the first diode module, and the second diode module are aligned in the first direction, and thus the length of the wire that connects the output terminal of the first switching module to the cathode terminal of the first diode module can easily be substantially equal to the length of the wire that connects the output terminal of the second switching module to the anode terminal of the second diode module. Consequently, when the modules are aligned in the direction (first direction) in which the railroad vehicle travels, in the three-level circuit, the surge voltage duty imposed on the symmetric switching elements on the electric circuit can be substantially equal between the upper potential side and the lower potential side while a reduction in the degree of freedom in arranging the modules is significantly reduced or prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a perspective view of a first standing wall of an intermediate potential conductor of the power conversion device according to the first embodiment;

FIG. 12 is a perspective view of a second standing wall of the intermediate potential conductor of the power conversion device according to the first embodiment;

FIG. 13 is a perspective view of a leg of the intermediate potential conductor of the power conversion device according to the first embodiment;

FIG. 18 is a schematic view of a power converter of a power conversion device according to a second embodiment as viewed from the side;

FIG. 19 is a schematic view of a power converter of a power conversion device according to a third embodiment as viewed from the side;

FIG. 20 is a schematic view for illustrating the lengths of wires that connect switching modules to diode modules of the power conversion device according to the third embodiment;

FIG. 23 is a schematic view of a power converter of a power conversion device according to a fifth embodiment as viewed from the side;

FIG. 26 is a circuit diagram of a power converter of a power conversion device according to a second modified example of the first embodiment.

DESCRIPTION OF THE PREFERRED EMBODIMENTS

Embodiments of the present invention are hereinafter described with reference to the drawings.

First Embodiment

The configuration of a power conversion device 100 according to a first embodiment of the present invention is now described with reference to FIGS. 1 to 17. The power conversion device 100 is a power conversion device mounted on a railroad vehicle 10.

Figure 1:
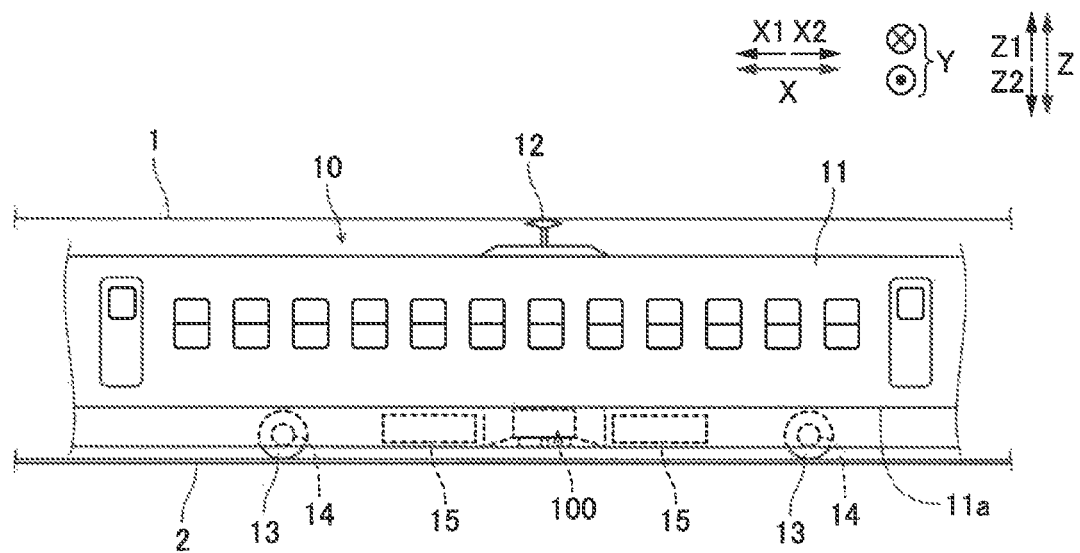
FIG. 1 is a schematic view showing a railroad vehicle on which a power conversion device according to a first embodiment is mounted.

As shown in FIG. 1, a railroad vehicle 10 is configured to travel on rails 2 with power supplied from an overhead wire 1 as an AC power supply. In the following description, the traveling direction of the railroad vehicle 10, a crosstie direction orthogonal to the traveling direction of the railroad vehicle 10, and the upward-downward direction of the railroad vehicle 10 are defined as an X direction, a Y direction, and a Z direction, respectively. Furthermore, the upper side (upward direction) and the lower side (downward direction) of the railroad vehicle 10 are defined as a Z1 side (Z1 direction) and a Z2 side (Z2 direction), respectively. The X direction, the Y direction, and the Z direction are examples of a "first direction", a "second direction", and a "third direction" in the claims, respectively. The term "crosstie" of the "crosstie direction" refers to a member that is laid under the rails 2 in such a manner as to be orthogonal to the rails 2 and supports the rails 2.

The railroad vehicle 10 includes a vehicle body 11, a pantograph 12, the power conversion device 100, induction motors 14 (see FIG. 2) that rotate drive wheels 13, and other devices 15 such as an air conditioner and controller. The power conversion device 100 is attached to the lower side (Z2 side) of the bottom 11a of the vehicle body 11. The pantograph 12 receives (collects) power supplied to the overhead wire 1. The power conversion device 100 converts the power from the overhead wire 1 by switching of semiconductor switching elements Q (see FIG. 3) and controls rotation of the induction motors 14 when the railroad vehicle 10 is traveling.

Figure 2:
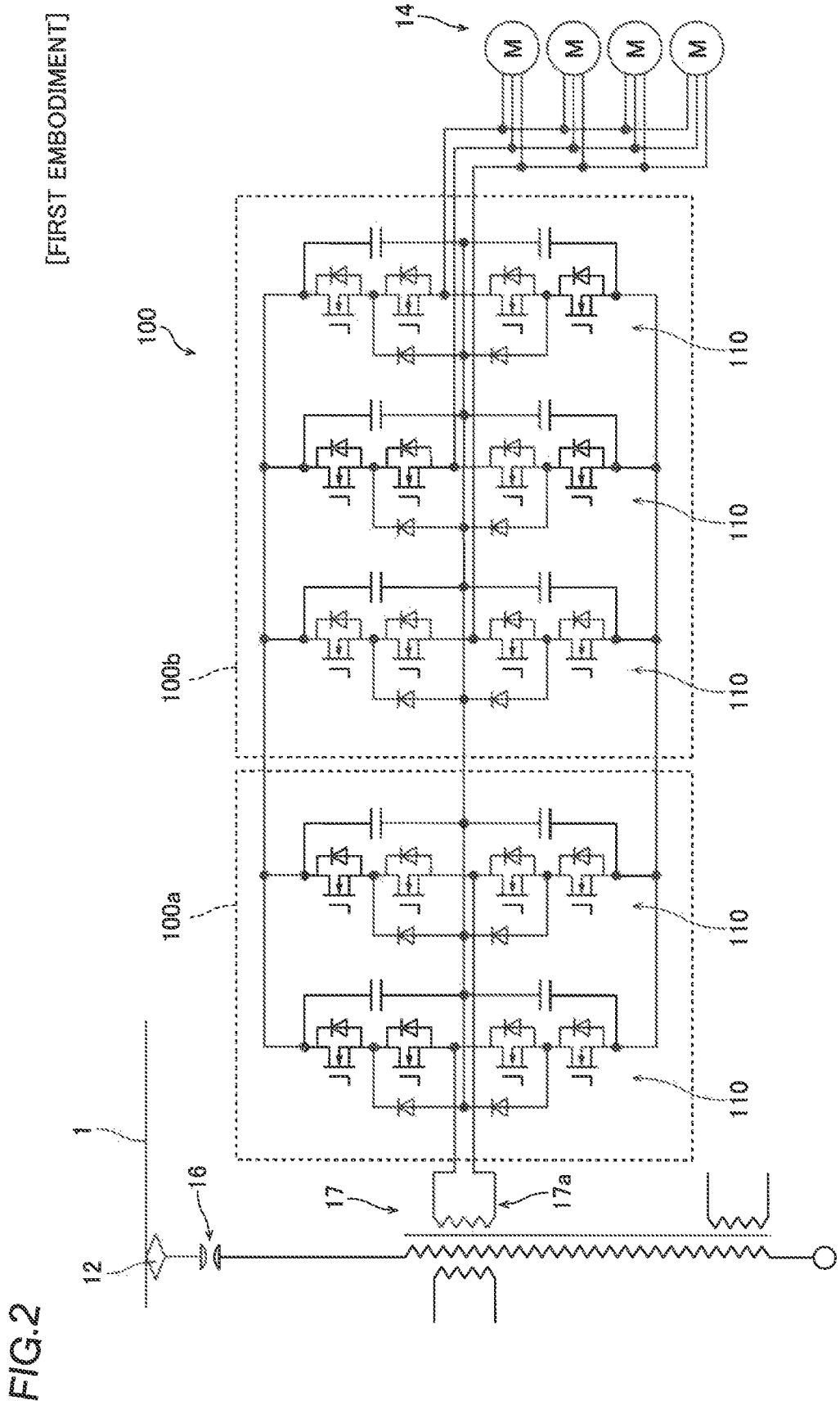
FIG. 2 is a circuit diagram of the power conversion device according to the first embodiment.

As shown in FIG. 2, a single-phase voltage is input from the pantograph 12 into a transformer 17 via a circuit breaker 16. A single-phase voltage is input from a secondary winding 17a of the transformer 17 into the power conversion device 100. The power conversion device 100 includes a converter 100a and an inverter 100b. The converter 100a converts the single-phase voltage input from the secondary winding 17a to a direct current voltage. The inverter 100b converts the direct current voltage input from the converter 100a to an alternating current voltage. The converted alternating current voltage is output from the inverter 100b to the induction motors 14 configured to drive the railroad vehicle 10.

In the power conversion device 100, the converter 100a includes two power converters 110 connected in parallel to each other. Furthermore, the inverter 100b includes three power converters 110 connected in parallel to each other. In the power conversion device 100, the five power converters 110 (the two power converters 110 of the converter 100a and the three power converters 110 of the inverter 100b) have substantially the same configuration. Therefore, in the following description, the configuration of one power converter 110 is described. Note that the power conversion device 100 is configured as a three-level circuit that can output power of three levels of potentials, an upper potential, an intermediate potential, and a lower potential.

Figure 3:
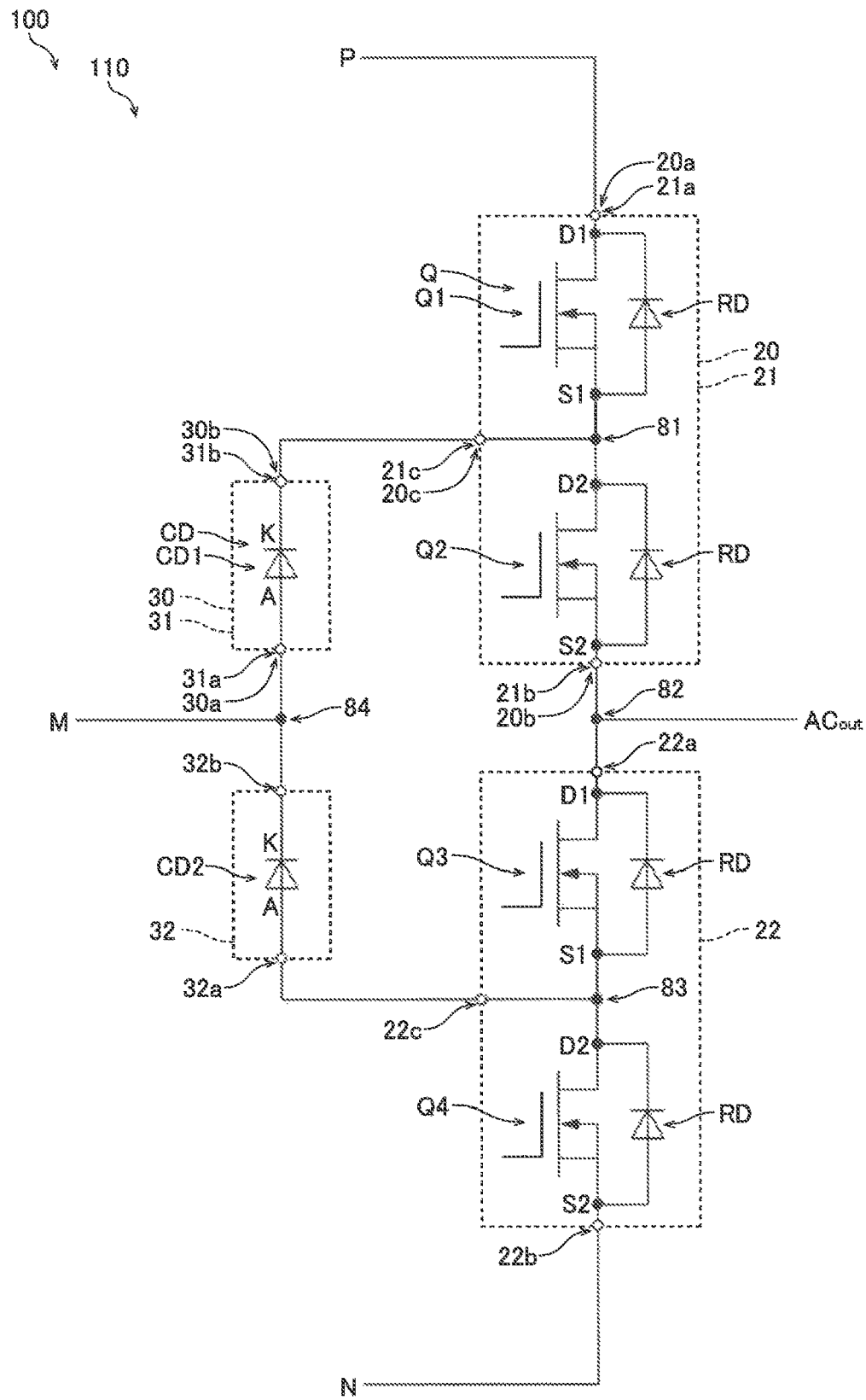
FIG. 3 is a circuit diagram of a power converter of the power conversion device according to the first embodiment.

As shown in FIG. 3, the power converter 110 includes four semiconductor switching elements Q (a first switching element Q1, a second switching element Q2, a third switching element Q3, and a fourth switching element Q4). The semiconductor switching elements Q are metal-oxide-semiconductor field-effect transistors (MOSFETs) made of silicon (Si) semiconductors. Diodes RD are connected in antiparallel to the semiconductor switching elements Q. The diodes RD function as so-called freewheeling diodes.

The four semiconductor switching elements Q are connected in series with each other. The four semiconductor switching elements Q are connected between a positive electrode potential point P and a negative electrode potential point N. Specifically, a drain D1 of the first switching element Q1 is electrically connected to the positive electrode potential point P. A source S1 of the first switching element Q1 is electrically connected to a drain D2 of the second switching element Q2 via a connection point 81. A source S2 of the second switching element Q2 is electrically connected to a drain D1 of the third switching element Q3 via a connection point 82. A source S1 of the third switching element Q3 is electrically connected to a drain D2 of the fourth switching element Q4 via a connection point 83. A source S2 of the fourth switching element Q4 is electrically connected to the negative electrode potential point N. The source S2 of the second switching element Q2 and the drain D1 of the third switching element Q3 are electrically connected to an alternate current (output) potential point $AC_{out}$ via the connection point 82.

The power converter 110 also includes two diodes CD (a first diode CD1 and a second diode CD2). The diodes CD are diodes made of silicon semiconductors, for example.

The two diodes CD are connected in series with each other. The diodes CD function as so-called clamp diodes. Specifically, a cathode K of the first diode CD1 is electrically connected to the source S1 of the first switching element Q1 and the drain D2 of the second switching element Q2 via the connection point 81. An anode A of the first diode CD1 is electrically connected to a cathode K of the second diode CD2 via a connection point 84. An anode A of the second diode CD2 is electrically connected to the source S1 of the third switching element Q3 and the drain D2 of the fourth switching element Q4 via the connection point 83. The anode A of the first diode CD1 and the cathode K of the second diode CD2 are electrically connected to an intermediate potential point M via the connection point 84.

As shown in FIG. 3, the power converter 110 includes two switching modules 20 (a first switching module 21 and a second switching module 22), and two diode modules 30 (a first diode module 31 and a second diode module 32). The switching modules 20 each include two semiconductor switching elements Q, and include positive-side terminals 20a, negative-side terminals 20b, and output terminals 20c. The switching modules 20 are so-called two-element modules (2-in-1 modules). The diode modules 30 each include a diode CD, and include anode terminals 30a and cathode terminals 30b. The diode modules 30 are so-called one-element modules (1-in-1 modules). Note that the first switching module 21 and the second switching module 22 include substantially the same package. Furthermore, the first diode module 31 and the second diode module 32 include substantially the same package.

Specifically, the first switching element Q1 and the second switching element Q2 are incorporated in the first switching module 21. The first switching module 21 includes positive-side terminals 21a, negative-side terminals 21b, and output terminals 21c as external connection terminals for a module. The positive-side terminals 21a of the first switching module 21 are provided on the positive electrode potential point P side of the drain D1 of the first switching element Q1. That is, the positive-side terminals 21a of the first switching module 21 are upper potential terminals. The negative-side terminals 21b of the first switching module 21 are provided on the connection point 82 side of the source S2 of the second switching element Q2. The output terminals 21c of the first switching module 21 are provided on the first diode module 31 side of the connection point 81.

The third switching element Q3 and the fourth switching element Q4 are incorporated in the second switching module 22. The second switching module 22 includes positive-side terminals 22a, negative-side terminals 22b, and output terminals 22c as external connection terminals for a module. The positive-side terminals 22a of the second switching module 22 are provided on the connection point 82 side of the drain D1 of the third switching element Q3. The negative-side terminals 22b of the second switching module 22 are provided on the negative electrode potential point N side of the source S2 of the fourth switching element Q4. That is, the negative-side terminals 22b of the second switching module 22 are lower potential terminals. The output terminals 22c of the second switching module 22 are provided on the second diode module 32 side of the connection point 83.

The first diode CD1 is incorporated in the first diode module 31. The first diode module 31 includes anode terminals 31a and cathode terminals 31b as external connection terminals for a module. The anode terminals 31a of the first diode module 31 are provided on the connection point 84 side of the anode A of the first diode CD1. That is, the anode terminals 31a of the first diode module 31 are intermediate potential terminals. The cathode terminals 31b of the first diode module 31 are provided on the first switching module 21 side of the cathode K of the first diode CD1. That is, the cathode terminals 31b of the first diode module 31 are connected to the output terminals 21c of the first switching module 21.

The second diode CD2 is incorporated in the second diode module 32. The second diode module 32 includes anode terminals 32a and cathode terminals 32b as external connection terminals for a module. The anode terminals 32a of the second diode module 32 are provided on the second switching module 22 side of the anode A of the second diode CD2. That is, the anode terminals 32a of the second diode module 32 are connected to the output terminals 22c of the second switching module 22. The cathode terminals 32b of the second diode module 32 are provided on the connection point 84 side of the cathode K of the second diode CD2. That is, the cathode terminals 32b of the second diode module 32 are intermediate potential terminals.

Figure 4:
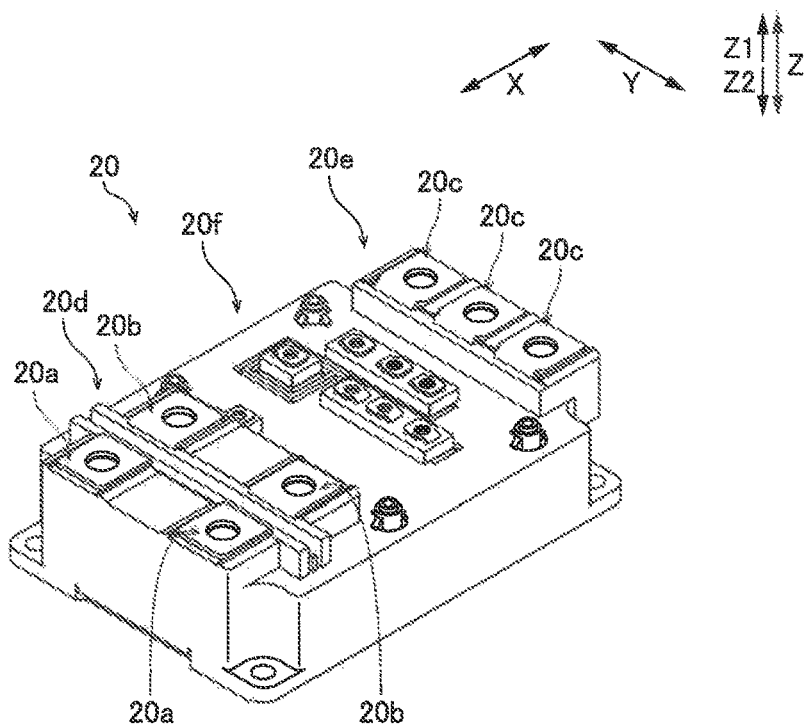
FIG. 4 is a perspective view of a switching module of the power conversion device according to the first embodiment.

As shown in FIG. 4, the switching modules 20 each have a substantially rectangular parallelepiped shape. The positive-side terminals 20a, the negative-side terminals 20b, and the output terminals 20c of the switching module 20 are provided on the upper side (Z1 side) of the switching module 20 having a substantially rectangular parallelepiped shape. In the switching module 20, two positive-side terminals 20a and two negative-side terminals 20b are aligned in the Y direction. In the switching module 20, three output terminals 20c are aligned in the Y direction. In the switching module 20, the positive-side terminals 20a, the negative-side terminals 20b, and the output terminals 20c are aligned in this order in the X direction.

In the switching module 20, the positive-side terminals 20a and the negative-side terminals 20b are arranged at an end 20d on one side in the X direction. Furthermore, in the switching module 20, the output terminals 20c are arranged at an end 20e on the other side in the X direction. That is, in the first embodiment, at least any two of the positive-side terminals 20a, the negative-side terminals 20b, and the output terminals 20c are respectively arranged at the end 20d on one side in the X direction and the end 20e on the other side in the X direction. In the switching module 20, a control board 20g (see FIG. 6) configured to control switching of the semiconductor switching elements Q is arranged in a space between the negative-side terminals 20b and the output terminals 20c (a central portion 20f in the X direction). In FIG. 4, illustration of the control board 20g is omitted.

Figure 5:
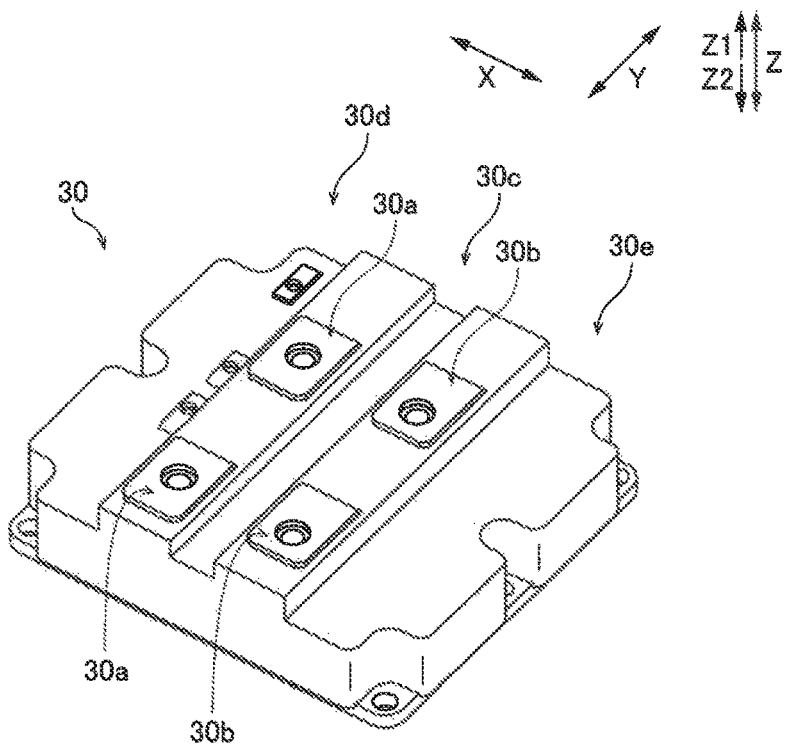
FIG. 5 is a perspective view of a diode module of the power conversion device according to the first embodiment.

As shown in FIG. 5, the diode modules 30 each have a substantially rectangular parallelepiped shape. The anode terminals 30a and the cathode terminals 30b of the diode module 30 are provided on the upper side (Z1 side) of the diode module 30 having a substantially rectangular parallelepiped shape. In the diode module 30, two anode terminals 30a and two cathode terminals 30b are aligned in the Y direction. In the diode module 30, the anode terminals 30a and the cathode terminals 30b are aligned in the X direction.

In the diode module 30, the anode terminals 30a and the cathode terminals 30b are arranged in a central portion 30c in the X direction. That is, in the first embodiment, each of the first diode module 31 and the second diode module 32 includes the anode terminals 30a and the cathode terminals 30b arranged in the central portion 30c in the X direction. In the diode module 30, the external connection terminals (the anode terminals 30a and the cathode terminals 30b) for a module are not arranged at a first end 30d in the X direction and a second end 30e in the X direction.

Figure 6:
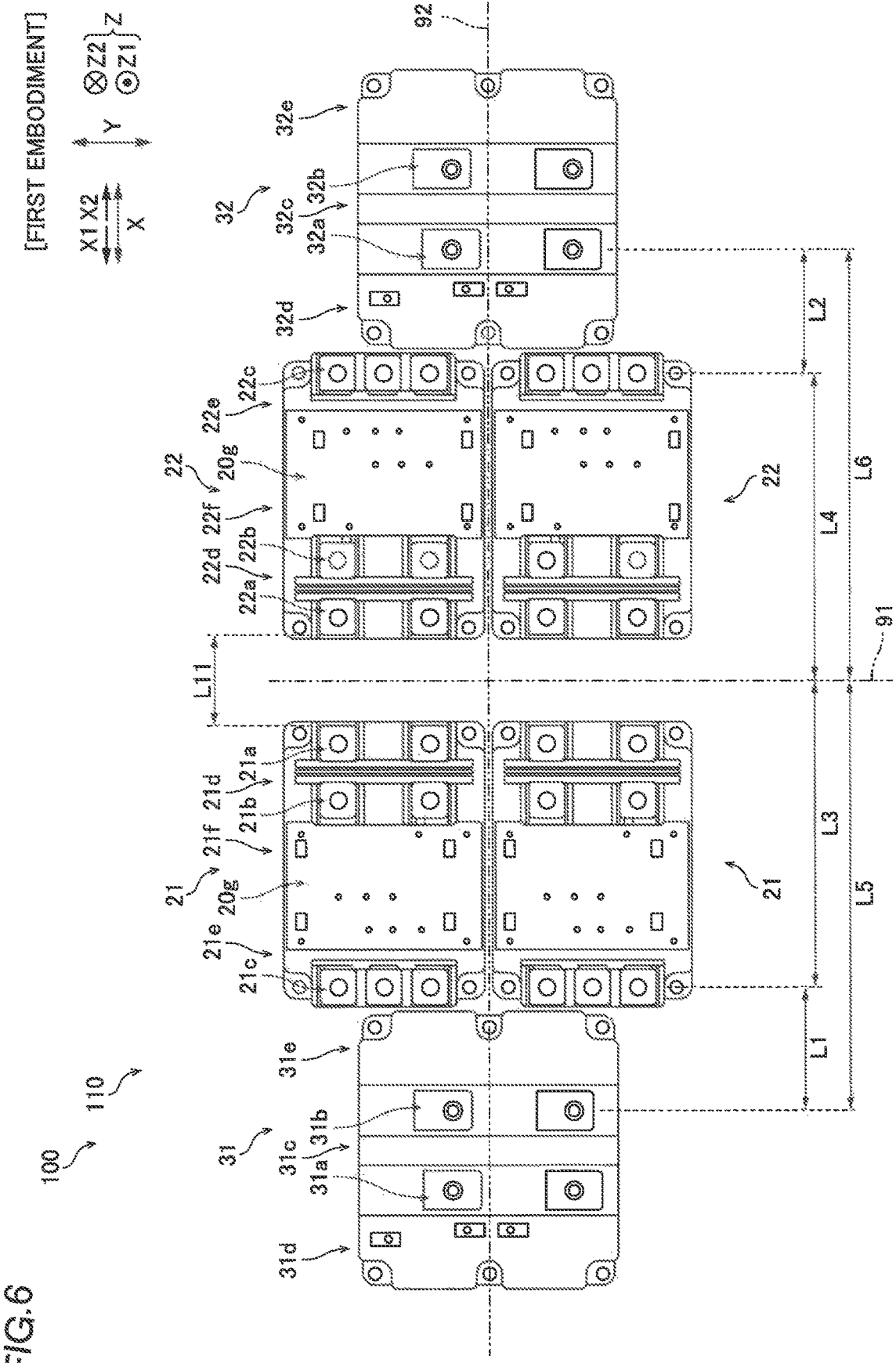
FIG. 6 is a top view showing an arrangement of switching modules and diode modules of the power conversion device according to the first embodiment.

As shown in FIG. 6, in the first embodiment, the first switching module 21, the second switching module 22, the first diode module 31, and the second diode module 32 are aligned in the X direction. Specifically, the first diode module 31, the first switching module 21, the second switching module 22, and the second diode module 32 are aligned in this order in the X direction from the X1 side toward the X2 side.

In the first embodiment, a plurality of (two) first switching modules 21 is connected in parallel so as to be aligned in the Y direction, and a plurality of (two) second switching modules 22 is connected in parallel so as to be aligned in the Y direction. Specifically, the two first switching modules 21 are aligned in the Y direction while the two second switching modules 22 are aligned in the Y direction. Although not shown in FIG. 6, the positive-side terminals 21a, the negative-side terminals 21b, and the output terminals 21c of one of the two first switching modules 21 are electrically connected to the positive-side terminals 21a, the negative-side terminals 21b, and the output terminals 21c of the other of the two first switching modules 21, respectively. In addition, the positive-side terminals 22a, the negative-side terminals 22b, and the output terminals 22c of one of the two second switching modules 22 are electrically connected to the positive-side terminals 22a, the negative-side terminals 22b, and the output terminals 22c of the other of the two second switching modules 22, respectively. The diode module 30, which is a one-element module (1-in-1 module), has a larger capacity package than the switching module 20, which is a two-element module (2-in-1 module), and thus one first diode module 31 and one second diode module 32 are provided (not connected in parallel).

The two first switching modules 21 and the two second switching modules 22 are arranged at substantially the same positions in the Y direction. The two first switching modules 21 and the two second switching modules 22 are arranged in such a manner that a centerline 92 between the two first switching modules 21 and between the two second switching modules 22 in the Y direction passes through the centers of the first diode module 31 and the second diode module 32 in the Y direction. That is, the first diode module 31, a set of two first switching modules 21, a set of two second switching modules 22, and the second diode module 32 are each substantially symmetric with respect to the centerline 92 in the Y direction.

In the first embodiment, a distance L1 between the output terminals 21c of the first switching modules 21 and the cathode terminals 31b of the first diode module 31 in the X direction is substantially equal to a distance L2 between the output terminals 22c of the second switching modules 22 and the anode terminals 32a of the second diode module 32 in the X direction.

Specifically, the positive-side terminals 21a, the negative-side terminals 21b, and the output terminals 21c of the first switching modules 21 and the positive-side terminals 22a, the negative-side terminals 22b, and the output terminals 22c of the second switching modules 22 are arranged in such a manner as to be substantially symmetric with respect to a centerline 91 along the Y direction. That is, the first switching modules 21 and the second switching modules 22 are arranged in such a manner as to be substantially symmetric with respect to the centerline 91. Furthermore, the cathode terminals 31b and the anode terminals 31a of the first diode module 31 and the anode terminals 32a and the cathode terminals 32b of the second diode module 32 are arranged in such a manner as to be substantially symmetric with respect to the centerline 91. That is, the first diode module 31 and the second diode module 32 are arranged in such a manner as to be substantially symmetric with respect to the centerline 91.

More specifically, the positive-side terminals 21a, the negative-side terminals 21b, and the output terminals 21c of the first switching modules 21 are aligned in this order from the X2 side toward the X1 side in the X direction. That is, in the first switching modules 21, the positive-side terminals 21a and the negative-side terminals 21b are arranged at ends 21d on the X2 side, and the output terminals 21c are arranged at ends 21e on the X1 side. The positive-side terminals 22a, the negative-side terminals 22b, and the output terminals 22c of the second switching modules 22 are aligned in this order from the X1 side toward the X2 side in the X direction. That is, in the second switching modules 22, the positive-side terminals 22a and the negative-side terminals 22b are arranged at ends 22d on the X1 side, and the output terminals 22c are arranged at ends 22e on the X2 side. The cathode terminals 31b and the anode terminals 31a of the first diode module 31 are aligned in this order from the X2 side toward the X1 side in the X direction. The anode terminals 32a and the cathode terminals 32b of the second diode module 32 are aligned in this order from the X1 side toward the X2 side in the X direction.

In the first embodiment, the first switching modules 21 and the second switching modules 22 are spaced apart from each other in the X direction in such a manner that the shortest distance L11 between the terminals of the first switching modules 21 and the terminals of the second switching modules 22 is equal to or longer than a predetermined insulation distance (determined in the power conversion device 100). Specifically, the shortest distance L11 between the terminals of the first switching modules 21 and the terminals of the second switching modules 22 corresponds to a distance between ends of the positive-side terminals 21a of the first switching modules 21 on the second switching module 22 side (X2 side) and ends of the positive-side terminals 22a of the second switching modules 22 on the first switching module 21 side (X1 side). The positive-side terminals 21a of the first switching modules 21 and the positive-side terminals 22a of the second switching modules 22 have different potentials, and thus the first switching modules 21 and the second switching modules 22 are spaced apart from each other in the X direction in such a manner that the shortest distance L11 is equal to or longer than the predetermined insulation distance (determined in the power conversion device 100).

Figure 7:
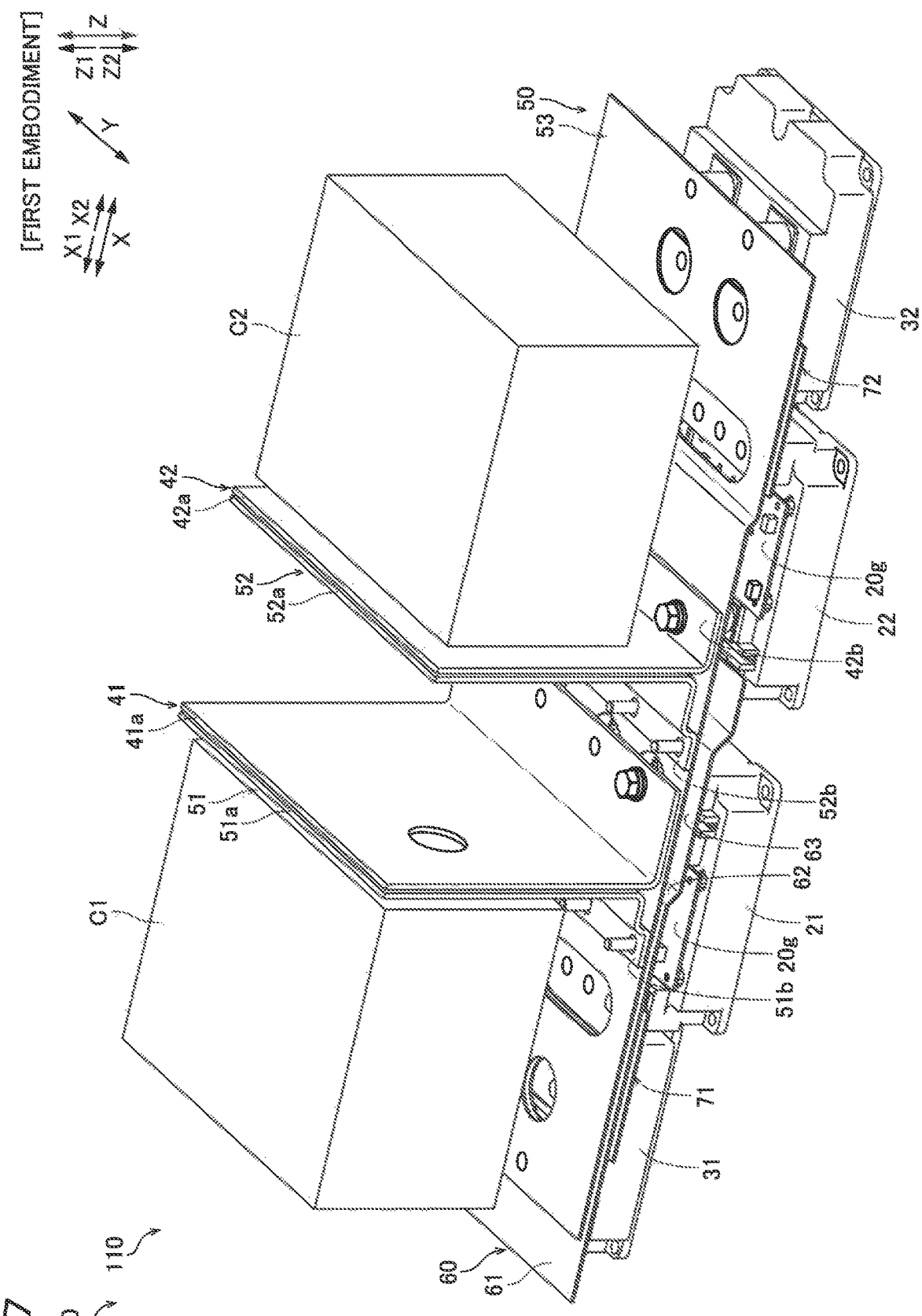
FIG. 7 is a perspective view of the power converter of the power conversion device according to the first embodiment.

As shown in FIG. 7, the power converter 110 includes a first capacitor C1 and a second capacitor C2. The first capacitor C1 and the second capacitor C2 each have a substantially rectangular parallelepiped shape. The first capacitor C1 and the second capacitor C2 are aligned in the X direction. The first capacitor C1 and the second capacitor C2 are arranged on the X1 side and the X2 side, respectively. The first capacitor C1 and the second capacitor C2 are arranged above (on the Z1 sides of) the first diode module 31, the first switching modules 21, the second switching modules 22, and the second diode module 32. As described below, the first capacitor C1 and the second capacitor C2 are connected in series with each other.

Figure 8:
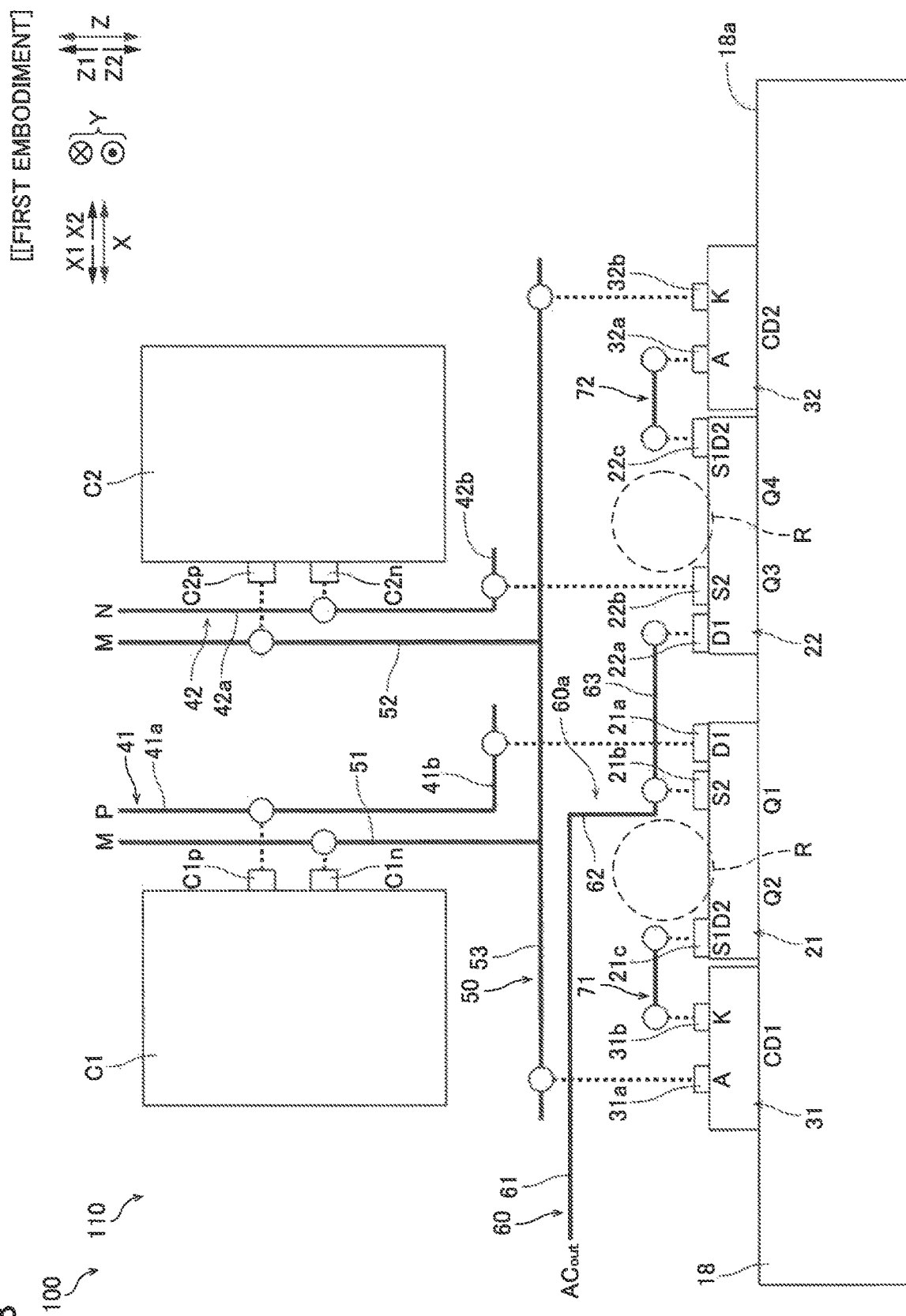
FIG. 8 is a schematic view of the power converter of the power conversion device according to the first embodiment as viewed from the side.

As shown in FIG. 8, the power converter 110 includes a cooler 18. The cooler 18 is provided in a lower portion (Z2 side) of the power converter 110. The cooler 18 includes cooling fins (not shown) that protrude downward (Z2 side) and extend in the X direction. A plurality of cooling fins is provided in such a manner as to be spaced apart from each other in the Y direction. The first diode module 31, the first switching modules 21, the second switching modules 22, and the second diode module 32 are aligned in the X direction on an arrangement surface 18a of the cooler 18 on the upper side (Z1 side).

As shown in FIG. 7, the power converter 110 includes a positive electrode potential conductor 41, a negative electrode potential conductor 42, an intermediate potential conductor 50, an alternating current potential conductor 60, a positive-side connection conductor 71, and a negative-side connection conductor 72. Each of the positive electrode potential conductor 41, the negative electrode potential conductor 42, the intermediate potential conductor 50, the alternating current potential conductor 60, the positive-side connection conductor 71, and the negative-side connection conductor 72 is a plate-shaped conductor (bus bar).

Figure 9:
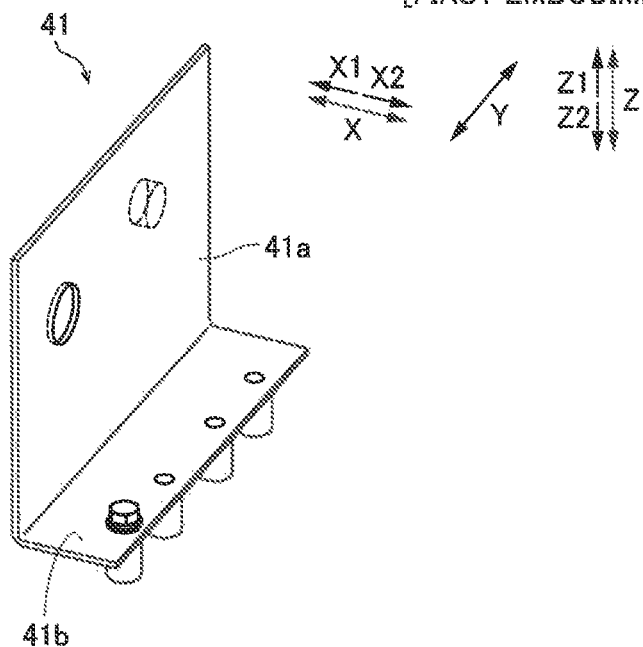
FIG. 9 is a perspective view of a positive electrode potential conductor of the power conversion device according to the first embodiment.

As shown in FIG. 9, the positive electrode potential conductor 41 includes a standing wall 41a that extends in the Z direction and a leg 41b that extends in the X direction. The leg 41b extends in an X2 direction from the lower (Z2 side) end of the standing wall 41a. The positive electrode potential conductor 41 is substantially L-shaped due to the standing wall 41a and the leg 41b. As shown in FIG. 8, the standing wall 41a of the positive electrode potential conductor 41 is arranged on the X2 side of the first capacitor C1.

The positive electrode potential conductor 41 is connected to a positive electrode terminal C1p of the first capacitor C1 and the positive-side terminals 21a of the first switching modules 21. Specifically, the positive electrode potential conductor 41 is connected to the positive electrode terminal C1p of the first capacitor C1 provided on the X2 side at the standing wall 41a. In addition, the positive electrode potential conductor 41 is connected to the positive-side terminals 21a of the first switching modules 21 provided on the upper side (Z1 side) at the leg 41b.

Figure 10:
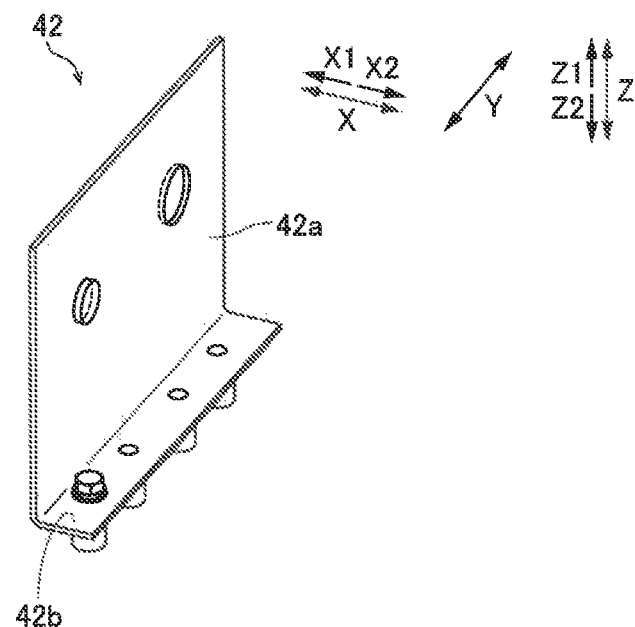
FIG. 10 is a perspective view of a negative electrode potential conductor of the power conversion device according to the first embodiment.

As shown in FIG. 10, the negative electrode potential conductor 42 includes a standing wall 42a that extends in the Z direction and a leg 42b that extends in the X direction. The leg 42b extends in the X2 direction from the lower (Z2 side) end of the standing wall 42a. The negative electrode potential conductor 42 is substantially L-shaped due to the standing wall 42a and the leg 42b. As shown in FIG. 8, the standing wall 42a of the negative electrode potential conductor 42 is arranged on the X1 side of the second capacitor C2. The leg 42b of the negative electrode potential conductor 42 is located at substantially the same position (height position) in the Z direction (arranged on the same plane) as that of the leg 41b of the positive electrode potential conductor 41.

The negative electrode potential conductor 42 is connected to a negative electrode terminal C2n of the second capacitor C2 and the negative-side terminals 22b of the second switching modules 22. Specifically, the negative electrode potential conductor 42 is connected to the negative electrode terminal C2n of the second capacitor C2 provided on the X1 side at the standing wall 42a. In addition, the negative electrode potential conductor 42 is connected to the negative-side terminals 22b of the second switching modules 22 provided on the upper side (Z1 side) at the leg 42b.

As shown in FIG. 11, the intermediate potential conductor 50 includes a first standing wall 51 that extends in the Z direction. The first standing wall 51 includes a first portion 51a that extends in the Z direction and a second portion 51b that extends in the X direction. The second portion 51b extends in an X1 direction from the lower (Z2 side) end of the first portion 51a. The first standing wall 51 is substantially L-shaped due to the first portion 51a and the second portion 51b. As shown in FIG. 8, in the first embodiment, the first standing wall 51 is adjacent to the standing wall 41a of the positive electrode potential conductor 41. Specifically, the first portion 51a of the first standing wall 51 faces the standing wall 41a of the positive electrode potential conductor 41 in the X direction in the vicinity of the X1 side of the standing wall 41a of the positive electrode potential conductor 41. That is, the first portion 51a of the first standing wall 51 and the standing wall 41a of the positive electrode potential conductor 41 are stacked with an insulating member (not shown) interposed therebetween.

As shown in FIG. 12, the intermediate potential conductor 50 includes a second standing wall 52 that extends in the Z direction. The second standing wall 52 includes a first portion 52a that extends in the Z direction and a second portion 52b that extends in the X direction. The second portion 52b extends in the X1 direction from the lower (Z2 side) end of the first portion 52a. The second standing wall 52 is substantially L-shaped due to the first portion 52a and the second portion 52b. As shown in FIG. 8, in the first embodiment, the second standing wall 52 is adjacent to the standing wall 42a of the negative electrode potential conductor 42. Specifically, the first portion 52a of the second standing wall 52 faces the standing wall 42a of the negative electrode potential conductor 42 in the X direction in the vicinity of the X1 side of the standing wall 42a of the negative electrode potential conductor 42. That is, the first portion 52a of the second standing wall 52 and the standing wall 42a of the negative electrode potential conductor 42 are stacked with an insulating member (not shown) interposed therebetween.

As shown in FIG. 13, the intermediate potential conductor 50 includes a leg 53 that extends in the X direction. As shown in FIG. 7, the leg 53 is fixed in contact with the second portion 51b of the first standing wall 51 in the Z direction. The leg 53 is fixed in contact with the second portion 52b of the second standing wall 52 in the Z direction. In the first embodiment, the leg 53 is adjacent to the leg 41b of the positive electrode potential conductor 41 and the leg 42b of the negative electrode potential conductor 42 in the Z direction. Specifically, the leg 53 of the intermediate potential conductor 50 faces the leg 41b of the positive electrode potential conductor 41 in the Z direction in the vicinity of the lower side (Z2 side) of the leg 41b of the positive electrode potential conductor 41. The leg 53 of the intermediate potential conductor 50 faces the leg 42b of the negative electrode potential conductor 42 in the Z direction in the vicinity of the lower side (Z2 side) of the leg 42b of the negative electrode potential conductor 42.

As shown in FIG. 8, the intermediate potential conductor 50 includes a negative electrode terminal C1n of the first capacitor C1, a positive electrode terminal C2p of the second capacitor C2, the anode terminals 31a of the first diode module 31, and the cathode terminals 32b of the second diode module 32. Specifically, the intermediate potential conductor 50 is connected to the negative electrode terminal C1n of the first capacitor C1 provided on the X2 side in the first portion 51a (see FIG. 11) of the first standing wall 51. The intermediate potential conductor 50 is connected to the positive electrode terminal C2p of the second capacitor C2 provided on the X1 side in the first portion 52a (see FIG. 12) of the second standing wall 52. Furthermore, the intermediate potential conductor 50 is connected to the anode terminals 31a of the first diode module 31 provided on the upper side (Z1 side) at the leg 53. In addition, the intermediate potential conductor 50 is connected to the cathode terminals 32b of the second diode module 32 provided on the upper side (Z1 side) at the leg 53.

Figure 14:
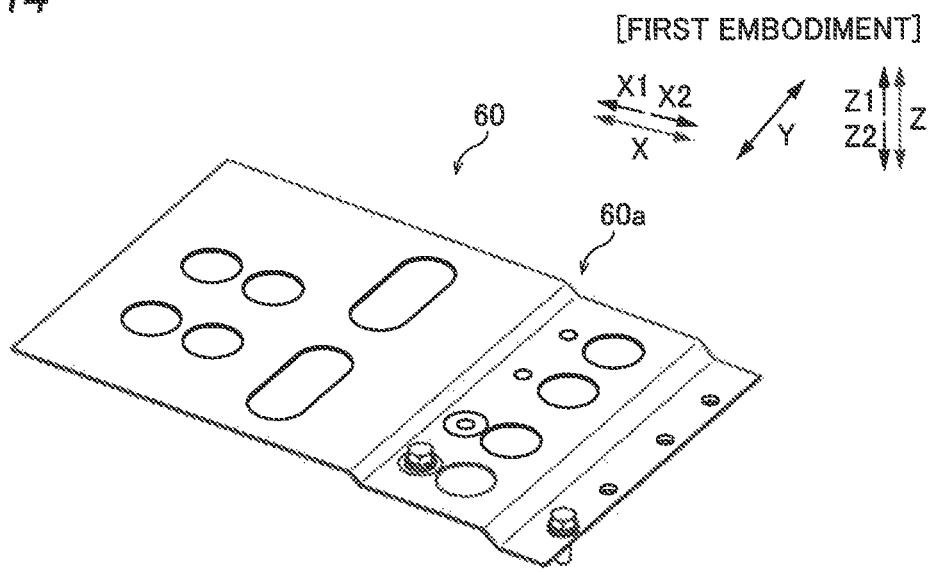
FIG. 14 is a perspective view of an alternating current potential conductor of the power conversion device according to the first embodiment.

As shown in FIG. 14, the alternating current potential conductor 60 extends in the X direction. As shown in FIG. 8, the alternating current potential conductor 60 is arranged below (on the Z2 side of) the leg 53 of the intermediate potential conductor 50. The alternating current potential conductor 60 is arranged above (on the Z1 sides of) the first diode module 31, the first switching modules 21, and the second switching modules 22.

The alternating current potential conductor 60 is connected to the negative-side terminals 21b of the first switching modules 21 and the positive-side terminals 22a of the second switching modules 22. Specifically, the alternating current potential conductor 60 is connected to the negative-side terminals 21b of the first switching modules 21 provided on the upper side (Z1 side). The alternating current potential conductor 60 is connected to the positive-side terminals 22a of the second switching modules 22 provided on the upper side (Z1 side).

In the first embodiment, the alternating current potential conductor 60 includes a bent portion 60a that is bent in such a manner as to be spaced apart from a region R in which the control boards 20g of the first switching modules 21 are arranged. Specifically, the alternating current potential conductor 60 includes a first portion 61 that extends in the X direction, a second portion 62 that extends downward (in the Z2 direction) from an end of the first portion 61 on the X2 side, and a third portion 63 that extends in the X2 direction from the lower (Z2 side) end of the second portion 62. The second portion 62 is arranged in the vicinity of the X2 side of the region R in which the control boards 20g are arranged. The first portion 61 that extends in the X1 direction from an end of the second portion 62 on the Z1 side is spaced apart from the region R on the Z1 side of the region R in which the control boards 20g are arranged. That is, the bent portion 60a is formed by the end of the first portion 61 on the X2 side, the second portion 62, and an end of the third portion 63 on the X1 side.

Figure 15:
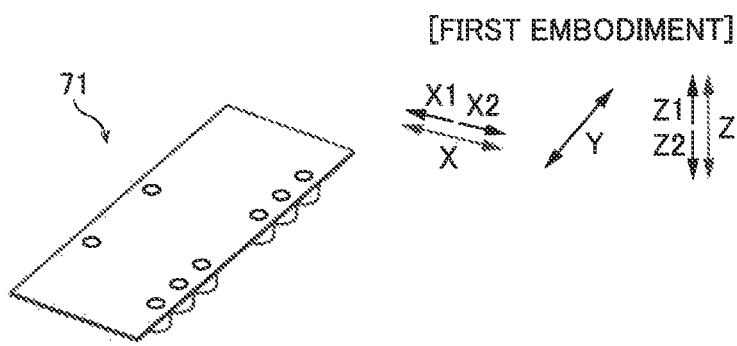
FIG. 15 is a perspective view of a positive-side connection conductor of the power conversion device according to the first embodiment.

As shown in FIG. 15, the positive-side connection conductor 71 extends in the X direction. As shown in FIG. 8, the positive-side connection conductor 71 is arranged below (on the Z2 side of) the alternating current potential conductor 60. The positive-side connection conductor 71 is arranged above (on the Z1 sides of) the first diode module 31 and the first switching modules 21.

The positive-side connection conductor 71 is connected to the output terminals 21c of the first switching modules 21 and the cathode terminals 31b of the first diode module 31. Specifically, the positive-side connection conductor 71 is connected to the output terminals 21c of the first switching modules 21 provided on the upper side (Z1 side) at its end on the X2 side. In addition, the positive-side connection conductor 71 is connected to the cathode terminals 31b of the first diode module 31 provided on the upper side (Z1 side) at its end on the X1 side.

Figure 16:
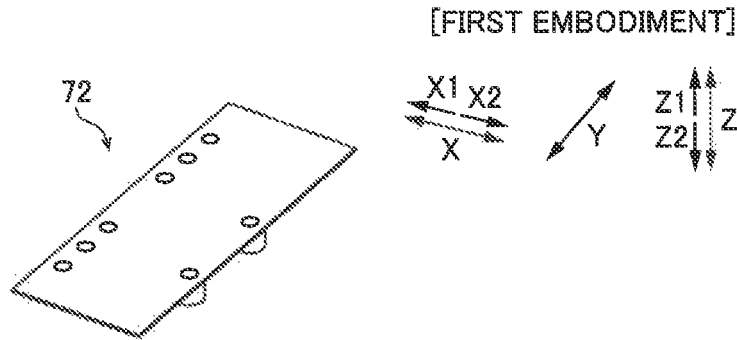
FIG. 16 is a perspective view of a negative-side connection conductor of the power conversion device according to the first embodiment.

As shown in FIG. 16, the negative-side connection conductor 72 extends in the X direction. As shown in FIG. 8, the negative-side connection conductor 72 is arranged below (on the Z2 side of) the leg 53 of the intermediate potential conductor 50. The negative-side connection conductor 72 is arranged above (on the Z1 sides of) the second switching modules 22 and the second diode module 32.

The negative-side connection conductor 72 is connected to the output terminals 22c of the second switching modules 22 and the anode terminals 32a of the second diode module 32. Specifically, the negative-side connection conductor 72 is connected to the output terminals 22c of the second switching modules 22 provided on the upper side (Z1 side) at its end on the X1 side. In addition, the negative-side connection conductor 72 is connected to the anode terminals 32a of the second diode module 32 provided on the upper side (Z1 side) at its end on the X2 side.

Figure 17:
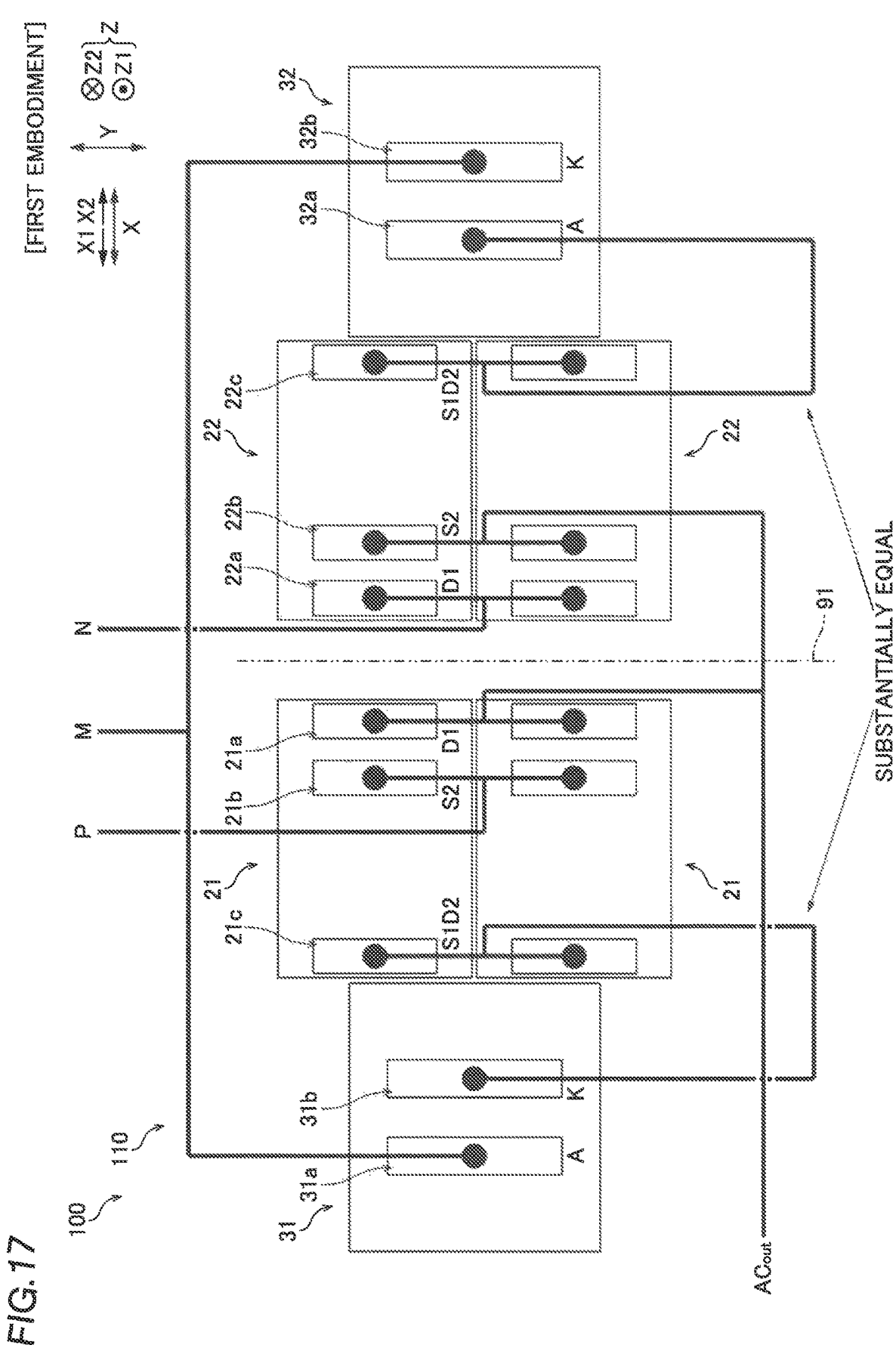
FIG. 17 is a schematic view for illustrating the lengths of wires that connect the switching modules to the diode modules of the power conversion device according to the first embodiment.

In the power converter 110, the terminals (the anode terminals 31a and the cathode terminals 31b) of the first diode module 31, the terminals (the positive-side terminals 21a, the negative-side terminals 21b, and the output terminals 21c) of the first switching modules 21, the terminals (the positive-side terminals 22a, the negative-side terminals 22b, and the output terminals 22c) of the second switching modules 22, and the terminals (the anode terminals 32a and the cathode terminals 32b) of the second diode module 32 are located at substantially the same positions (height positions) in the Z direction (arranged on the same plane). In the power converter 110, the positive-side connection conductor 71, the negative-side connection conductor 72, and the third portion 63 of the alternating current potential conductor 60 are located at substantially the same positions (height positions) in the Z direction (arranged on the same plane). That is, the leg 41b of the positive electrode potential conductor 41 and the leg 42b of the negative electrode potential conductor 42 (arranged on the same plane), the leg 53 of the intermediate potential conductor 50, and the positive-side connection conductor 71, the negative-side connection conductor 72, and the third portion 63 of the alternating current potential conductor 60 (arranged on the same plane) are stacked in this order with insulating members (not shown) interposed therebetween. The positive-side connection conductor 71 is connected to the output terminals 21c of the first switching modules 21 at its end on the X2 side, and is connected to the cathode terminals 31b of the first diode module 31 at its end on the X1 side. The negative-side connection conductor 72 is connected to the output terminals 22c of the second switching modules 22 at its end on the X1 side, and is connected to the anode terminals 32a of the second diode module 32 at its end on the X2 side. As described above, in the power converter 110, the distance L1 between the output terminals 21c of the first switching modules 21 and the cathode terminals 31b of the first diode module 31 in the X direction is substantially equal to the distance L2 between the output terminals 22c of the second switching modules 22 and the anode terminals 32a of the second diode module 32 in the X direction. Consequently, as shown in FIG. 17, in the power converter 110, the length of a wire that connects the output terminals 21c of the first switching modules 21 to the cathode terminals 31b of the first diode module 31 is substantially equal to the length of a wire that connects the output terminals 22c of the second switching modules 22 to the anode terminals 32a of the second diode module 32.

In the power converter 110, the cathode terminals 31b are arranged on the X2 sides of the anode terminals 31a in the first diode module 31, and the output terminals 21c are arranged on the X1 sides of the positive-side terminals 21a and the negative-side terminals 21b in the first switching modules 21. Thus, in the power converter 110, the length of the wire that connects the output terminals 21c of the first switching modules 21 to the cathode terminals 31b of the first diode module 31 is relatively short. Similarly, in the power converter 110, the output terminals 22c are arranged on the X2 sides of the positive-side terminals 22a and the negative-side terminals 22b in the second switching modules 22, and the anode terminals 32a are arranged on the X1 sides of the cathode terminals 32b in the second diode module 32. Thus, in the power converter 110, the length of the wire that connects the output terminals 22c of the second switching modules 22 to the anode terminals 32a of the second diode module 32 is relatively short.

Advantageous Effects of First Embodiment

According to the first embodiment, the following advantageous effects are achieved.

According to the first embodiment, as described above, in the power conversion device 100, the distance L1 between the output terminals 21c of the first switching modules 21 and the cathode terminals 31b of the first diode module 31 in the X direction is adapted to be substantially equal to the distance L2 between the output terminals 22c of the second switching modules 22 and the anode terminals 32a of the second diode module 32 in the X direction. Accordingly, when the first switching modules 21, the second switching modules 22, the first diode module 31, and the second diode module 32 are aligned in the X direction, the length of the wire that connects the output terminals 21c of the first switching modules 21 to the cathode terminals 31b of the first diode module 31 can easily be substantially equal to the length of the wire that connects the output terminals 22c of the second switching modules 22 to the anode terminals 32a of the second diode module 32. Furthermore, in the power conversion device 100, the first diode module 31 and the second diode module 32 are separately provided. Accordingly, unlike the case in which the diode CD (first diode CD1) connected to the output terminals 21c of the first switching modules 21 and the diode CD (second diode CD2) connected to the output terminals 22c of the second switching modules 22 are incorporated in one module, the terminals (the cathode terminals 31b of the first diode module 31) to which the output terminals 21c of the first switching modules 21 are connected, and the terminals (the anode terminals 32a of the second diode module 32) to which the output terminals 22c of the second switching modules 22 are connected can be individually arranged. Therefore, regardless of the arrangement positions of the first switching modules 21 and the second switching modules 22, the distance L1 between the output terminals 21c of the first switching modules 21 and the cathode terminals 31b of the first diode module 31 in the X direction can easily (i.e., while a reduction in the degree of freedom in arranging the modules is significantly reduced or prevented) be substantially equal to the distance L2 between the output terminals 22c of the second switching modules 22 and the anode terminals 32a of the second diode module 32 in the X direction. Consequently, in the three-level circuit, the circuit inductance that exists in commutation circuits of the semiconductor switching elements Q can be substantially equal between the upper potential side and the lower potential side while a reduction in the degree of freedom in arranging the modules is significantly reduced or prevented (the circuit inductance that exists in commutation paths at the time of turning off the first switching element Q1 and the fourth switching element Q4 can be substantially equal, and the circuit inductance that exists in commutation paths at the time of turning off the second switching element Q2 and the third switching element Q3 can be substantially equal). That is, in the three-level circuit, the surge voltage duty imposed on the symmetric semiconductor switching elements Q on an electric circuit can be substantially equal between the upper potential side and the lower potential side while a reduction in the degree of freedom in arranging the modules is significantly reduced or prevented (the surge voltage duty imposed on the first switching element Q1 and the surge voltage duty imposed on the fourth switching element Q4 can be substantially equal to each other, and the surge voltage duty imposed on the second switching element Q2 and the surge voltage duty imposed on the third switching element Q3 can be substantially equal to each other).

According to the first embodiment, as described above, the output terminals 21c of the first switching modules 21 and the output terminals 22c of the second switching modules 22 are arranged in such a manner as to be substantially symmetric with respect to the centerline 91 along the Y direction orthogonal to the X direction. Furthermore, the cathode terminals 31b of the first diode module 31 and the anode terminals 32a of the second diode module 32 are arranged in such a manner as to be substantially symmetric with respect to the centerline 91. Accordingly, a distance L3 (see FIG. 6) from the centerline 91 to the output terminals 21c of the first switching modules 21 on a first side (X1 side) in the X direction can be substantially equal to a distance L4 (see FIG. 6) from the centerline 91 to the output terminals 22c of the second switching modules 22 on a second side (X2 side) in the X direction. Furthermore, a distance L5 (see FIG. 6) from the centerline 91 to the cathode terminals 31b of the first diode module 31 on the first side (X1 side) can be substantially equal to a distance L6 (see FIG. 6) from the centerline 91 to the anode terminals 32a of the second diode module 32 on the second side (X2 side). Consequently, the configuration in which the distance L1 between the output terminals 21c of the first switching modules 21 and the cathode terminals 31b of the first diode module 31 in the X direction is substantially equal to the distance L2 between the output terminals 22c of the second switching modules 22 and the anode terminals 32a of the second diode module 32 in the X direction can be easily achieved.

According to the first embodiment, as described above, the positive-side terminals 21a, the negative-side terminals 21b, and the output terminals 21c of the first switching modules 21 and the positive-side terminals 22a, the negative-side terminals 22b, and the output terminals 22c of the second switching modules 22 are arranged in such a manner as to be substantially symmetric with respect to the centerline 91. Furthermore, the cathode terminals 31b and the anode terminals 31a of the first diode module 31 and the anode terminals 32a and the cathode terminals 32b of the second diode module 32 are arranged in such a manner as to be substantially symmetric with respect to the centerline 91. Accordingly, the configuration in which the output terminals 21c of the first switching modules 21 and the output terminals 22c of the second switching modules 22 are arranged in such a manner as to be substantially symmetric with respect to the centerline 91 can be easily achieved by using, as the first switching modules 21 and the second switching modules 22, the switching modules 20 in which the arrangements of the positive-side terminals 20a, the negative-side terminals 20b, and the output terminals 20c are substantially the same as each other. Furthermore, the configuration in which the cathode terminals 31b of the first diode module 31 and the anode terminals 32a of the second diode module 32 are arranged in such a manner as to be substantially symmetric with respect to the centerline 91 can be easily achieved by using, as the first diode module 31 and the second diode module 32, the diode modules 30 in which the arrangements of the anode terminals 30a and the cathode terminals 30b are substantially the same as each other.

According to the first embodiment, as described above, the first switching modules 21 and the second switching modules 22 include substantially the same package, and are arranged in such a manner as to be substantially symmetric with respect to the centerline 91. Furthermore, the first diode module 31 and the second diode module 32 include substantially the same package, and are arranged in such a manner as to be substantially symmetric with respect to the centerline 91. Accordingly, the arrangement of the output terminals 20c in the switching module 20 is substantially the same between the first switching modules 21 and the second switching modules 22, and thus the configuration in which the output terminals 21c of the first switching modules 21 and the output terminals 22c of the second switching modules 22 are arranged in such a manner as to be substantially symmetric with respect to the centerline 91 can be easily achieved. Furthermore, the arrangement of the anode terminals 30a and the cathode terminals 30b in the diode module 30 is substantially the same between the first diode module 31 and the second diode module 32, and thus the configuration in which the cathode terminals 31b of the first diode module 31 and the anode terminals 32a of the second diode module 32 are arranged in such a manner as to be substantially symmetric with respect to the centerline 91 can be easily achieved.

According to the first embodiment, as described above, the first switching modules 21 are configured in such a manner that at least any two of the positive-side terminals 21a, the negative-side terminals 21b, and the output terminals 21c are respectively arranged at the ends 21e on the first side (X1 side) in the X direction and the ends 21d on the second side (X2 side) in the X direction. Furthermore, the second switching modules 22 are configured in such a manner that at least any two of the positive-side terminals 22a, the negative-side terminals 22b, and the output terminals 22c are respectively arranged at the ends 22d on the first side (X1 side) in the X direction and the ends 22e on the second side (X2 side) in the X direction. In addition, each of the first diode module 31 and the second diode module 32 is configured in such a manner that the anode terminals 30a and the cathode terminals 30b are arranged in the central portion 30c in the X direction. Accordingly, in each of the first diode module 31 and the second diode module 32, the anode terminals 30a and the cathode terminals 30b are arranged in the central portion 30c in the X direction, and thus the anode terminals 30a and the cathode terminals 30b can be spaced apart from ends in the X direction. Consequently, when another module is arranged adjacent to the first diode module 31 or the second diode module 32 in the X direction, an increase in the separation distance of the module due to ensuring of an insulation distance between terminals in the X direction can be significantly reduced or prevented.

According to the first embodiment, as described above, the first diode module 31, the first switching modules 21, the second switching modules 22, and the second diode module 32 are aligned in this order in the X direction. Furthermore, the first switching modules 21 and the second switching modules 22 are spaced apart from each other in the X direction in such a manner that the shortest distance L11 between the terminals of the first switching modules 21 and the terminals of the second switching modules 22 is equal to or longer than the predetermined insulation distance (determined in the power conversion device 100). Accordingly, the dielectric strength between the terminals of the first switching modules 21 on the second switching module 22 side and the terminals of the second switching modules 22 on the first switching module 21 side can be effectively ensured.

According to the first embodiment, as described above, the power conversion device 100 includes the first capacitor C1 and the second capacitor C2 connected in series with each other, the positive electrode potential conductor 41, the negative electrode potential conductor 42, and the intermediate potential conductor 50. The positive electrode potential conductor 41 is connected to the positive electrode terminal C1p of the first capacitor C1 and the positive-side terminals 21a of the first switching modules 21. The negative electrode potential conductor 42 is connected to the negative electrode terminal C2n of the second capacitor C2 and the negative-side terminals 22b of the second switching modules 22. The intermediate potential conductor 50 is connected to the negative electrode terminal C1n of the first capacitor C1, the positive electrode terminal C2p of the second capacitor C2, the anode terminals 31a of the first diode module 31, and the cathode terminals 32b of the second diode module 32. The positive electrode potential conductor 41 and the negative electrode potential conductor 42 each include the standing wall (the standing wall 41a or the standing wall 42a) configured to extend in the Z direction orthogonal to the X direction and the Y direction. Furthermore, the intermediate potential conductor 50 includes the first standing wall 51 and the second standing wall 52 configured to extend in the Z direction in such a manner as to be adjacent to the standing walls (the standing wall 41a and the standing wall 42a) of the positive electrode potential conductor 41 and the negative electrode potential conductor 42. Accordingly, the standing wall 41a of the positive electrode potential conductor 41 and the first standing wall 51 of the intermediate potential conductor 50, through which currents flow in opposite directions, are adjacent to each other (stacked), and thus the inductance of each of the standing wall 41a of the positive electrode potential conductor 41 and the first standing wall 51 of the intermediate potential conductor 50 can be reduced. Furthermore, the standing wall 42a of the negative electrode potential conductor 42 and the second standing wall 52 of the intermediate potential conductor 50, through which currents flow in opposite directions, are adjacent to each other, and thus the inductance of each of the standing wall 42a of the negative electrode potential conductor 42 and the second standing wall 52 of the intermediate potential conductor 50 can be reduced. In addition, according to the first embodiment, as described above, the positive-side connection conductor 71, the negative-side connection conductor 72, the third portion 63 of the alternating current potential conductor 60, and the leg 53 of the intermediate potential conductor 50 are adjacent to each other (stacked). Accordingly, the circuit inductance that exists in the commutation path at the time of turning off each of the first switching element Q1, the second switching element Q2, the third switching element Q3, and the fourth switching element Q4 can be reduced.

According to the first embodiment, as described above, the positive electrode potential conductor 41 and the negative electrode potential conductor 42 each include the leg (the leg 41b or the leg 42b) configured to extend in the X direction. Furthermore, the intermediate potential conductor 50 includes the leg 53 configured to extend in the X direction in such a manner as to be adjacent in the Z direction to the leg (the leg 41b or the leg 42b) of each of the positive electrode potential conductor 41 and the negative electrode potential conductor 42. Accordingly, the terminals of the first switching modules 21 and the second switching modules 22, in which the positive-side terminals 20a, the negative-side terminals 20b, and the output terminals 20c are aligned in the X direction, can be easily connected to the terminals of the first diode module 31 and the second diode module 32, in which the anode terminals 30a and the cathode terminals 30b are aligned in the X direction, by the leg 41b of the positive electrode potential conductor 41, the leg 42b of the negative electrode potential conductor 42, and the leg 53 of the intermediate potential conductor 50, which are configured to extend in the X direction.

According to the first embodiment, as described above, the power conversion device 100 includes the alternating current potential conductor 60 connected to the negative-side terminals 21b of the first switching modules 21 and the positive-side terminals 22a of the second switching modules 22 and configured to extend in the X direction. Furthermore, the alternating current potential conductor 60 includes the bent portion 60a that is bent in such a manner as to be spaced apart from the region R in which the control boards 20g of the first switching modules 21 are arranged. Accordingly, even when the alternating current potential conductor 60 is arranged in the vicinity of the first switching modules 21 or the second switching modules 22 in such a manner as to extend in the X direction, the bent portion 60a of the alternating current potential conductor 60 is bent such that a space in which the control boards 20g are arranged can be easily ensured between the alternating current potential conductor 60 and the first switching modules 21 can be easily ensured.

According to the first embodiment, as described above, the plurality of first switching modules 21 is connected in parallel to each other so as to be aligned in the Y direction, and the plurality of second switching modules 22 is connected in parallel to each other so as to be aligned in the Y direction. Accordingly, the direction (Y direction) in which the switching modules 20 are connected in parallel is orthogonal to the direction (X direction) in which the positive-side terminals 20a, the negative-side terminals 20b, and the output terminals 20c of the switching modules 20 are aligned, and the anode terminals 30a and the cathode terminals 30b of the diode modules 30 are aligned, and thus the power capacity of the power conversion device 100 can be increased while the configuration in which the distance L1 between the output terminals 21c of the first switching modules 21 and the cathode terminals 31b of the first diode module 31 in the X direction is substantially equal to the distance L2 between the output terminals 22c of the second switching modules 22, and the anode terminals 32a of the second diode module 32 in the X direction is maintained. Furthermore, the direction (X direction) in which the first switching modules 21 and the second switching modules 22 are aligned is orthogonal to the direction (Y direction) in which the switching modules 20 connected in parallel are aligned, and thus as compared with the case in which all the modules are aligned in one direction, an increase in the size of the power conversion device 100 in one direction can be significantly reduced or prevented.

According to the first embodiment, as described above, the power conversion device 100 is configured as a power conversion device mounted on the railroad vehicle 10. Furthermore, the first switching modules 21, the second switching modules 22, the first diode module 31, and the second diode module 32 are aligned in the X direction, which is the traveling direction of the railroad vehicle 10. Accordingly, the first switching modules 21, the second switching modules 22, the first diode module 31, and the second diode module 32 are aligned in the X direction, and thus the length of the wire that connects the output terminals 21c of the first switching modules 21 to the cathode terminals 31b of the first diode module 31 can easily be substantially equal to the length of the wire that connects the output terminals 22c of the second switching modules 22 to the anode terminals 32a of the second diode modules 32. Consequently, when the modules are aligned in the direction (X direction) in which the railroad vehicle 10 travels, in the three-level circuit, the surge voltage duty imposed on the symmetric switching elements Q on an electric circuit can be substantially equal between the upper potential side and the lower potential side while a reduction in the degree of freedom in arranging the modules is significantly reduced or prevented.

Second Embodiment

A second embodiment is now described with reference to FIG. 18. In this second embodiment, an alternating current potential conductor 260 does not include a bent portion unlike the first embodiment in which the alternating current potential conductor 60 includes the bent portion 60a. In the figure, the same configurations as those of the first embodiment are denoted by the same reference numerals.

Figure 18:
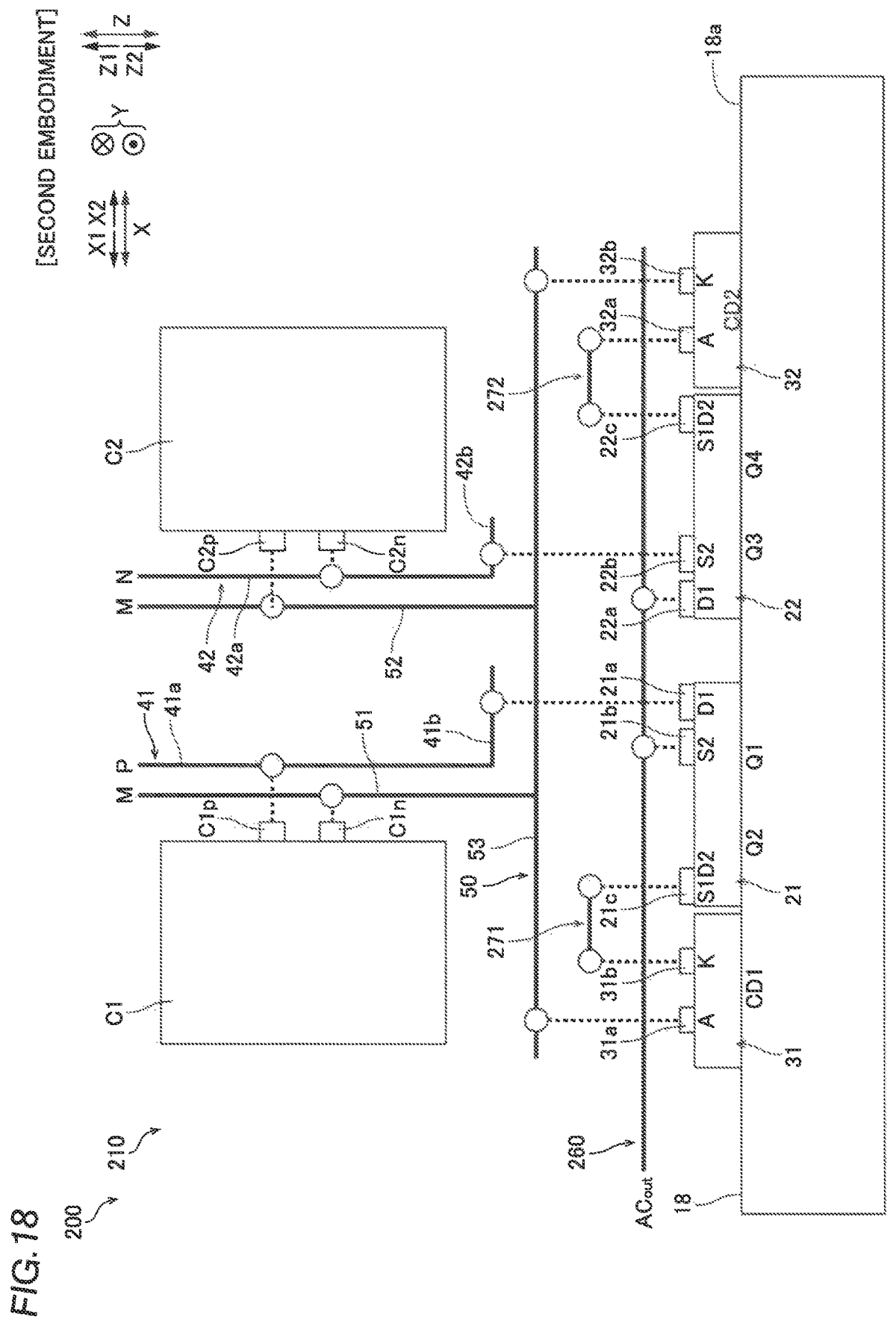

As shown in FIG. 18, a power conversion device 200 according to the second embodiment of the present invention includes a power converter 210. The power converter 210 includes the alternating current potential conductor 260, a positive-side connection conductor 271, and a negative-side connection conductor 272.

The alternating current potential conductor 260 extends in an X direction. The alternating current potential conductor 260 is arranged below (on the Z2 sides of) the positive-side connection conductor 271 and the negative-side connection conductor 272. Furthermore, the alternating current potential conductor 260 is arranged above (on the Z1 sides of) a first diode module 31, first switching modules 21, second switching modules 22, and a second diode module 32.

Similar to the alternating current potential conductor 60 according to the first embodiment, the alternating current potential conductor 260 is configured in such a manner that its end on the X1 side is located on the X1 side of anode terminals 31a of the first diode module 31 in the X direction. Unlike the alternating current potential conductor 60 according to the first embodiment, the alternating current potential conductor 260 is configured in such a manner that its end on the X2 side is located in the vicinity of the upper sides (Z1 sides) of cathode terminals 32b of the second diode module 32. Furthermore, unlike the alternating current potential conductor 60 according to the first embodiment, the alternating current potential conductor 260 is configured (arranged on the same plane) in such a manner that its position (height position) in a Z direction is substantially the same from its end on the X1 side to its end on the X2 side. That is, in the power converter 210, the alternating current potential conductor 260 does not include a bent portion.

The positive-side connection conductor 271 and the negative-side connection conductor 272 are arranged on the same plane (at substantially the same height position in the Z direction) below (on the Z2 side of) a leg 53 of an intermediate potential conductor 50. Furthermore, the positive-side connection conductor 271 and the negative-side connection conductor 272 are arranged above (on the Z1 side of) the alternating current potential conductor 260. That is, a leg 41b of a positive electrode potential conductor 41 and a leg 42b of a negative electrode potential conductor 42 (arranged on the same plane), the leg 53 of the intermediate potential conductor 50, the positive-side connection conductor 271 and the negative-side connection conductor 272 (arranged on the same plane), and the alternating current potential conductor 260 are stacked in this order with insulating members (not shown) interposed therebetween.

The remaining configurations of the second embodiment are similar to those of the first embodiment.

Advantageous Effects of Second Embodiment

According to the second embodiment, the following advantageous effects are achieved.

According to the second embodiment, as described above, the alternating current potential conductor 260 is configured in such a manner that its height position is substantially the same from its end on the X1 side to its end on the X2 side. Accordingly, a process of manufacturing the conductor can be simplified as compared with the case in which the alternating current potential conductor 260 includes a bent portion.

The remaining advantageous effects of the second embodiment are similar to those of the first embodiment.

Third Embodiment

A third embodiment is now described with reference to FIGS. 19 and 20. In this third embodiment, the arrangement of first switching modules 321 and a first diode module 331 in an X direction and the arrangement of a second diode module 332 and second switching modules 322 in the X direction are opposite to those of the first embodiment. In the figures, the same configurations as those of the first embodiment are denoted by the same reference numerals.

Figure 19:
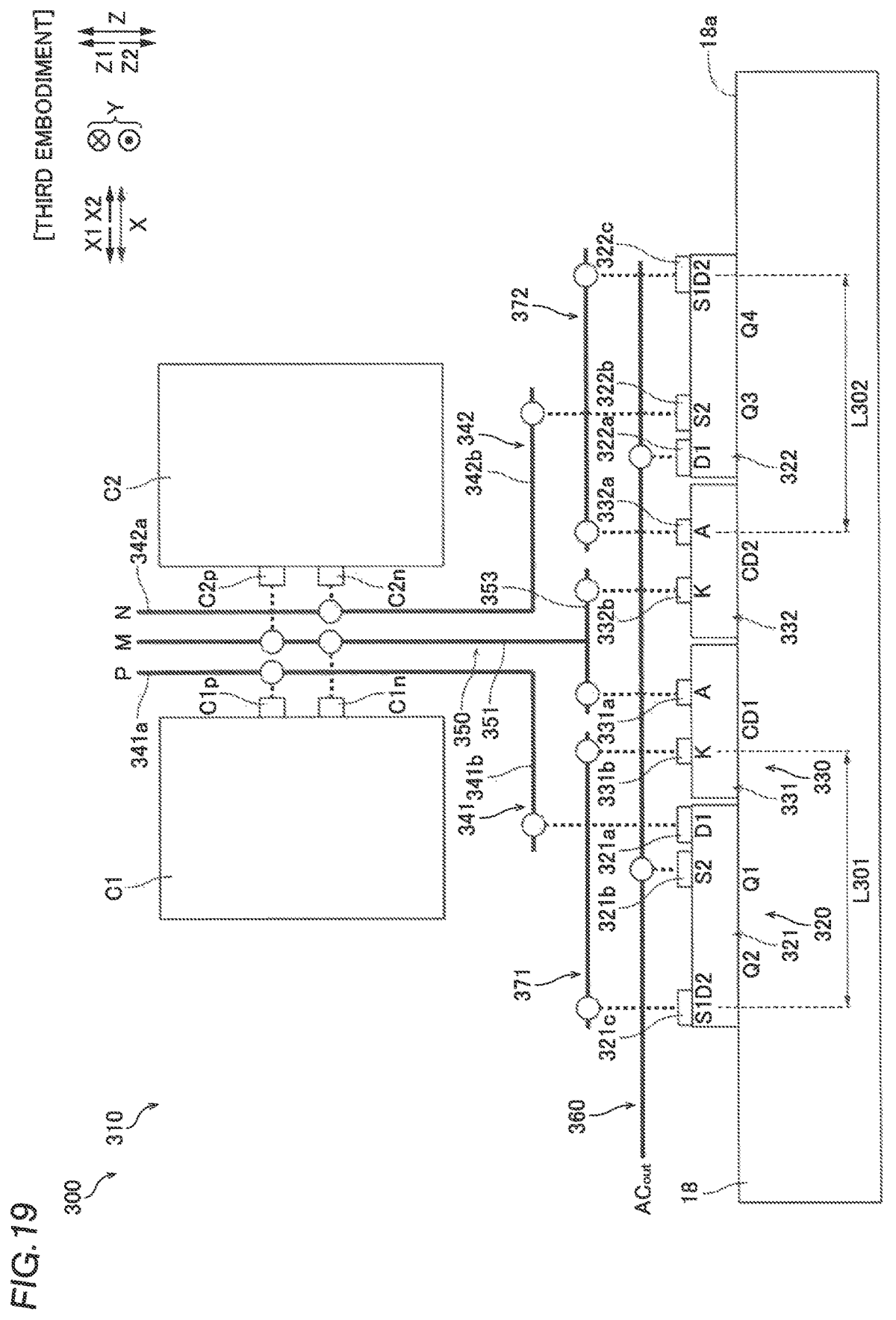

As shown in FIG. 19, a power conversion device 300 according to the third embodiment of the present invention includes a power converter 310. The power converter 310 includes two switching modules 320 (the first switching module 321 and the second switching module 322) and two diode modules 330 (the first diode module 331 and the second diode module 332).

The first switching modules 321 each include positive-side terminals 321a, negative-side terminals 321b, and output terminals 321c as external connection terminals for a module. The second switching modules 322 each include positive-side terminals 322a, negative-side terminals 322b, and output terminals 322c as external connection terminals for a module. The first diode module 331 includes anode terminals 331a and cathode terminals 331b as external connection terminals for a module. The second diode module 332 includes anode terminals 332a and cathode terminals 332b as external connection terminals for a module.

In the third embodiment, the first switching modules 321, the first diode module 331, the second diode module 332, and the second switching modules 322 are aligned in this order from the X1 side toward the X2 side in the X direction. Note that the first switching modules 321, the first diode module 331, the second diode module 332, and the second switching modules 322 are arranged close to the module(s) adjacent in the X direction.

In the third embodiment, unlike the first embodiment, the anode terminals 331a and the cathode terminals 331b of the first diode module 331 are aligned in this order from the X2 side toward the X1 side in the X direction. Furthermore, the cathode terminals 332b and the anode terminals 332a of the second diode module 332 are aligned in this order from the X1 side toward the X2 side in the X direction. That is, in the third embodiment, the terminal arrangement (the order of the anode terminals 331a and the cathode terminals 331b) of the first diode module 331 in the X direction is opposite to that of the first embodiment. Furthermore, the terminal arrangement (the order of the anode terminals 332a and the cathode terminals 332b) of the second diode module 332 in the X direction is opposite to that of the first embodiment.

In the third embodiment, similar to the first embodiment, a distance L301 between the output terminals 321c of the first switching modules 321 and the cathode terminals 331b of the first diode module 331 in the X direction is substantially equal to a distance L302 between the output terminals 322c of the second switching modules 322 and the anode terminals 332a of the second diode module 332 in the X direction.

The power converter 310 includes a positive electrode potential conductor 341, a negative electrode potential conductor 342, an intermediate potential conductor 350, an alternating current potential conductor 360, a positive-side connection conductor 371, and a negative-side connection conductor 372.

The positive electrode potential conductor 341 includes a standing wall 341a and a leg 341b. The leg 341b extends in an X1 direction from the lower (Z2 side) end of the standing wall 341a.

The negative electrode potential conductor 342 includes a standing wall 342a and a leg 342b. The leg 342b extends in an X2 direction from the lower (Z2 side) end of the standing wall 342a.

The intermediate potential conductor 350 includes a standing wall 351 that extends in a Z direction. In the third embodiment, the standing wall 351 is adjacent to the standing wall 341a of the positive electrode potential conductor 341 and the standing wall 342a of the negative electrode potential conductor 342. Specifically, the standing wall 351 faces the standing wall 341a of the positive electrode potential conductor 341 in the X direction in the vicinity of the X2 side of the standing wall 341a of the positive electrode potential conductor 341, and faces the standing wall 342a of the negative electrode potential conductor 342 in the X direction in the vicinity of the X1 side of the standing wall 342a of the negative electrode potential conductor 342. In other words, the standing wall 341a of the positive electrode potential conductor 341, the standing wall 351, and the standing wall 342a of the negative electrode potential conductor 342 are stacked in this order with insulating members (not shown). The standing wall 351 is an example of a "first standing wall" or a "second standing wall" in the claims.

The intermediate potential conductor 350 includes a leg 353. In the third embodiment, the leg 353 is adjacent to the leg 341b of the positive electrode potential conductor 341, the leg 342b of the negative electrode potential conductor 342, and the alternating current potential conductor 360 in the Z direction. Specifically, the leg 353 of the intermediate potential conductor 350 faces the leg 341b of the positive electrode potential conductor 341 in the Z direction in the vicinity of the lower side (Z2 side) of the leg 341b of the positive electrode potential conductor 341. The leg 353 of the intermediate potential conductor 350 faces the leg 342b of the negative electrode potential conductor 342 in the Z direction in the vicinity of the lower side (Z2 side) of the leg 342b of the negative electrode potential conductor 342. Furthermore, the leg 353 of the intermediate potential conductor 350 faces the alternating current potential conductor 360 in the Z direction in the vicinity of the upper side (Z1 side) of the alternating current potential conductor 360.

The alternating current potential conductor 360 is arranged below (on the Z2 sides) of the leg 353 of the intermediate potential conductor 350, the positive-side connection conductor 371, and the negative-side connection conductor 372. The alternating current potential conductor 360 is arranged above (on the Z1 sides of) the first switching modules 321, the first diode module 331, the second diode module 332, and the second switching modules 322.

The alternating current potential conductor 360 is configured in such a manner that its end on the X1 side is located on the X1 side of the output terminals 321c of the first switching modules 321 in the X direction. Furthermore, the alternating current potential conductor 360 is configured in such a manner that its end on the X2 side is located in the vicinity of the upper sides (Z1 side) of the output terminals 322c of the second switching modules 322 in the X direction. Unlike the alternating current potential conductor 60 according to the first embodiment, the alternating current potential conductor 360 is configured (arranged on the same plane) in such a manner that its position (height position) in the Z direction is substantially the same from its end on the X1 side to its end on the X2 side. That is, in the power converter 310, the alternating current potential conductor 360 does not include a bent portion.

The positive-side connection conductor 371 is arranged below (on the Z2 side of) the leg 341b of the positive electrode potential conductor 341. Furthermore, the negative-side connection conductor 372 is arranged below (on the Z2 side of) the leg 342b of the negative electrode potential conductor 342. The positive-side connection conductor 371 and the negative-side connection conductor 372 are arranged above (on the Z1 side of) the alternating current potential conductor 360. The positive-side connection conductor 371 and the negative-side connection conductor 372 are configured (arranged on the same plane) in such a manner that their positions (height positions) in the Z direction are substantially the same as that of the leg 353 of the intermediate potential conductor 350. That is, the leg 341b of the positive electrode potential conductor 341 and the leg 342b of the negative electrode potential conductor 342 (arranged on the same plane), the leg 353 of the intermediate potential conductor 350, the positive-side connection conductor 371, and the negative-side connection conductor 372 (arranged on the same plane), and the alternating current potential conductor 360 are stacked in this order with insulating members (not shown) interposed therebetween.

Figure 20:
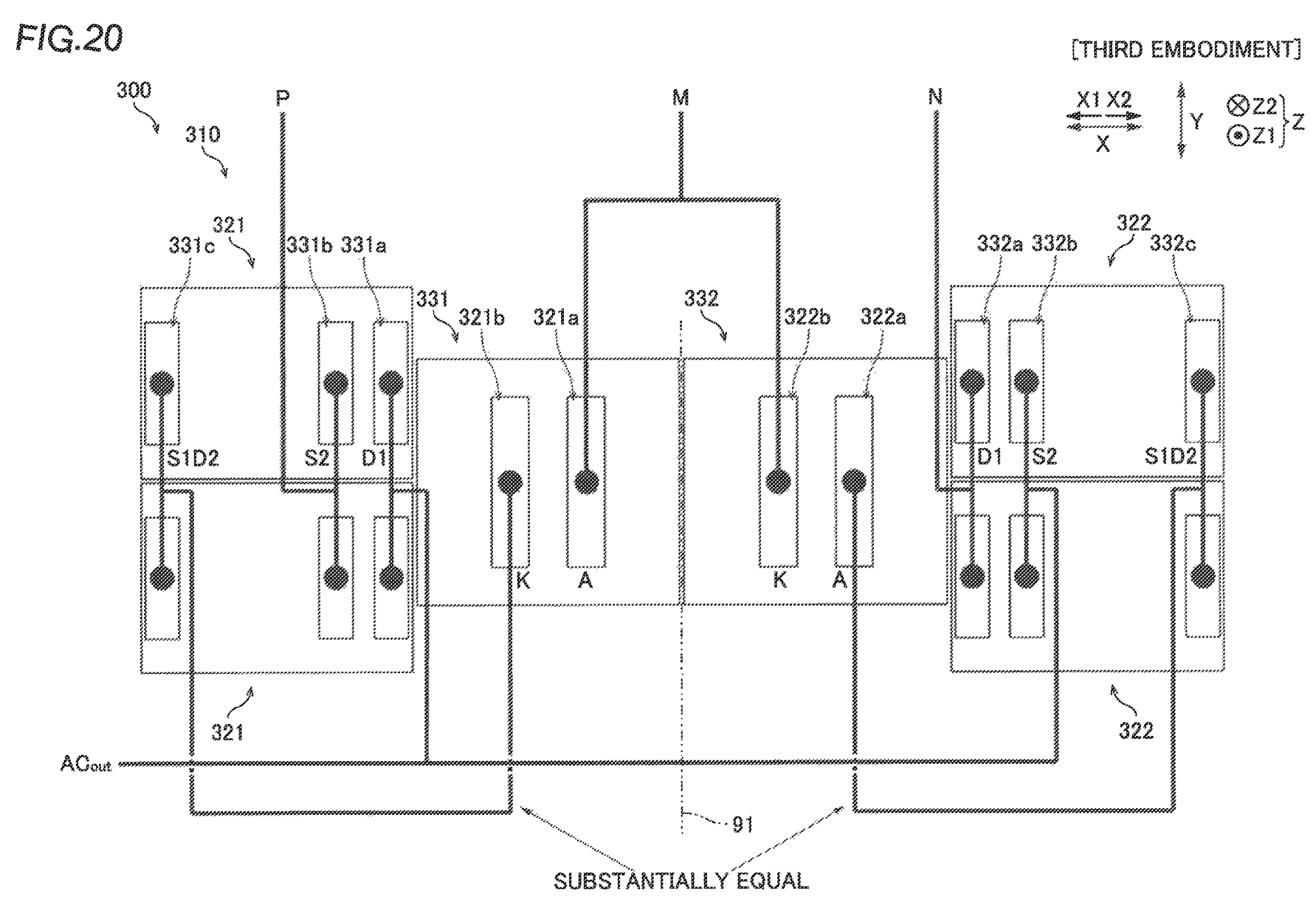

As shown in FIG. 20, in the power converter 310, similarly to the first embodiment, the length of a wire that connects the output terminals 321c of the first switching modules 321 to the cathode terminals 331b of the first diode module 331 is substantially equal to the length of a wire that connects the output terminals 322c of the second switching modules 322 to the anode terminals 332a of the second diode module 332.

The remaining configurations of the third embodiment are similar to those of the first embodiment.

Advantageous Effects of Third Embodiment

According to the third embodiment, the following advantageous effects are achieved.

According to the third embodiment, as described above, the first switching modules 321, the first diode module 331, the second diode module 332, and the second switching modules 322 are aligned in this order in the X direction. Accordingly, the switching modules 320 including the terminals at their ends on a first side in the X direction and their ends on a second side in the X direction are not adjacent to each other, and thus it is not necessary to space the switching modules 320 apart from each other in the X direction in order to ensure an insulation distance, unlike the case in which the switching modules 320 are adjacent to each other. Consequently, as compared with the case in which the switching modules 320 are adjacent to each other, the modules can be arranged closer to each other, and thus the power conversion device 300 can be downsized.

The remaining advantageous effects of the third embodiment are similar to those of the first embodiment.

Fourth Embodiment

A fourth embodiment is now described with reference to FIGS. 21 and 22. In this fourth embodiment, the terminal arrangements of first switching modules 421 in an X direction and the terminal arrangements of second switching modules 422 in the X direction are opposite to those of the first embodiment. In the figures, the same configurations as those of the first embodiment are denoted by the same reference numerals.

Figure 21:
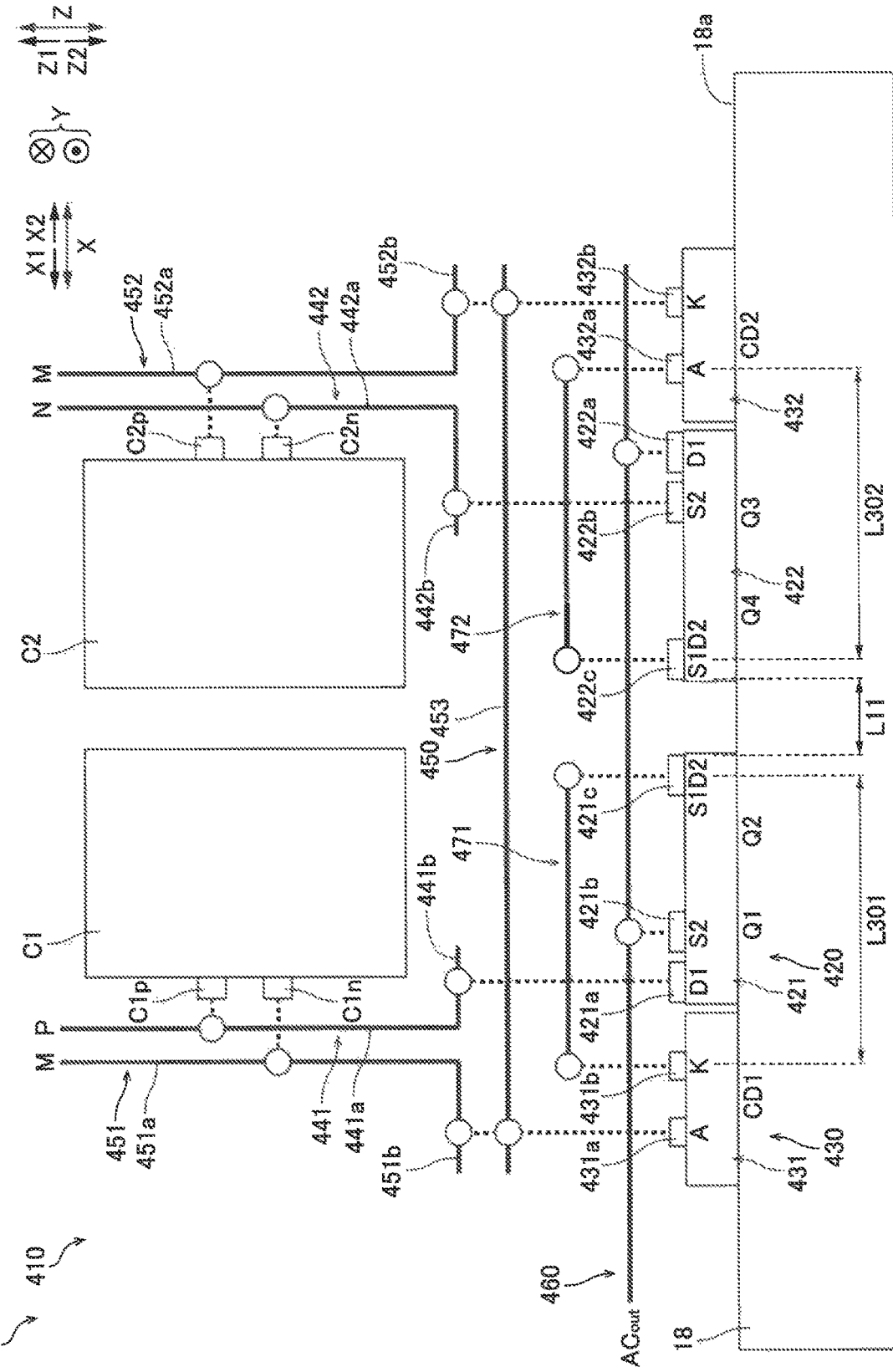
FIG. 21 is a schematic view of a power converter of a power conversion device according to a fourth embodiment as viewed from the side.

As shown in FIG. 21, a power conversion device 400 according to the fourth embodiment of the present invention includes a power converter 410. The power converter 410 includes two switching modules 420 (the first switching module 421 and the second switching module 422) and two diode modules 430 (a first diode module 431 and a second diode module 432).

The first switching modules 421 each include positive-side terminals 421a, negative-side terminals 421b, and output terminals 421c as external connection terminals for a module. The second switching modules 422 each include positive-side terminals 422a, negative-side terminals 422b, and output terminals 422c as external connection terminals for a module. The first diode module 431 includes anode terminals 431a and cathode terminals 431b as external connection terminals for a module. The second diode module 432 includes anode terminals 432a and cathode terminals 432b as external connection terminals for a module.

In the fourth embodiment, similarly to the first embodiment, the first switching modules 421, the first diode module 431, the second diode module 432, and the second switching modules 422 are aligned in this order from the X1 side toward the X2 side in the X direction. Furthermore, similarly to the first embodiment, the first switching modules 421 and the second switching modules 422 are spaced apart from each other in the X direction in such a manner that the shortest distance L11 between the terminals of the first switching modules 421 and the terminals of the second switching modules 422 is equal to or longer than a predetermined insulation distance (determined in the power conversion device 400).

On the other hand, in the fourth embodiment, unlike the first embodiment, the output terminals 421c, the negative-side terminals 421b, and the positive-side terminals 421a of the first switching modules 421 are aligned in this order from the X2 side toward the X1 side in the X direction. The output terminals 422c, the negative-side terminals 422b, and the positive-side terminals 422a of the second switching modules 422 are aligned in this order from the X1 side toward the X2 side in the X direction.

In the fourth embodiment, similarly to the first embodiment, a distance L301 between the output terminals 421c of the first switching modules 421 and the cathode terminals 431b of the first diode module 431 in the X direction is substantially equal to a distance L302 between the output terminals 422c of the second switching modules 422 and the anode terminals 432a of the second diode module 432 in the X direction.

The power converter 410 includes a positive electrode potential conductor 441, a negative electrode potential conductor 442, an intermediate potential conductor 450, an alternating current potential conductor 460, a positive-side connection conductor 471, and a negative-side connection conductor 472.

The positive electrode potential conductor 441 includes a standing wall 441a and a leg 441b. The leg 441b extends in an X2 direction from the lower (Z2 side) end of the standing wall 441a. The standing wall 441a of the positive electrode potential conductor 441 is arranged on the X1 side of a first capacitor C1.

The negative electrode potential conductor 442 includes a standing wall 442a and a leg 442b. The leg 442b extends in an X1 direction from the lower (Z2 side) end of the standing wall 442a. The standing wall 442a of the negative electrode potential conductor 442 is arranged on the X1 side of a second capacitor C2.

The intermediate potential conductor 450 includes a first standing wall 451. The first standing wall 451 includes a first portion 451a that extends in a Z direction and a second portion 451b that extends in the X direction. The second portion 451b extends in the X1 direction from the lower (Z2 side) end of the first portion 451a. In the fourth embodiment, similarly to the first embodiment, the first standing wall 451 is adjacent to the standing wall 441a of the positive electrode potential conductor 441. Specifically, the first portion 451a of the first standing wall 451 faces the standing wall 441a of the positive electrode potential conductor 441 in the X direction in the vicinity of the X1 side of the standing wall 441a of the positive electrode potential conductor 441.

The intermediate potential conductor 450 includes a second standing wall 452 that extends in the Z direction. The second standing wall 452 includes a first portion 452a that extends in the Z direction and a second portion 452b that extends in the X direction. The second portion 452b extends in the X2 direction from the lower (Z2 side) end of the first portion 452a. In the fourth embodiment, similarly to the first embodiment, the second standing wall 452 is adjacent to the standing wall 442a of the negative electrode potential conductor 442. Specifically, the first portion 452a of the second standing wall 452 faces the standing wall 442a of the negative electrode potential conductor 442 in the X direction in the vicinity of the X1 side of the standing wall 442a of the negative electrode potential conductor 442.

The intermediate potential conductor 450 includes a leg 453 that extends in the X direction. The leg 453 is arranged below (on the Z2 sides of) the second portion 451b of the first standing wall 451 and the second portion 452b of the second standing wall 452. Similarly to the first embodiment, the leg 453 is fixed in contact with the second portion 451b of the first standing wall 451 in the Z direction. The leg 453 is fixed in contact with the second portion 452b of the second standing wall 452 in the Z direction. Furthermore, similarly to the first embodiment, the leg 453 of the intermediate potential conductor 450 faces the leg 441b of the positive electrode potential conductor 441 in the Z direction in the vicinity of the lower side (Z2 side) of the leg 441b of the positive electrode potential conductor 441. The leg 453 of the intermediate potential conductor 450 faces the leg 442b of the negative electrode potential conductor 442 in the Z direction in the vicinity of the lower side (Z2 side) of the leg 442b of the negative electrode potential conductor 442. The leg 441b of the positive electrode potential conductor 441, the leg 442b of the negative electrode potential conductor 442, the second portion 451b of the first standing wall 451, and the second portion 452b of the second standing wall 452 are arranged on the same plane.

The alternating current potential conductor 460 is arranged below (on the Z2 sides of) the positive-side connection conductor 471 and the negative-side connection conductor 472. Furthermore, the alternating current potential conductor 460 is arranged above (on the Z1 sides of) the first switching modules 421, the first diode module 431, the second diode module 432, and the second switching modules 422.

The alternating current potential conductor 460 is configured in such a manner that its end on the X1 side is located on the X1 side of the anode terminals 431a of the first diode module 431 in the X direction. Furthermore, the alternating current potential conductor 460 is configured in such a manner that its end on the X2 side is located in the vicinity of the upper sides (Z1 sides) of the cathode terminals 432b of the second diode module 432 in the X direction. Unlike the alternating current potential conductor 60 according to the first embodiment, the alternating current potential conductor 460 is configured (arranged on the same plane) in such a manner that its position (height position) in the Z direction is substantially the same from its end on the X1 side to its end on the X2 side. That is, in the power converter 410, the alternating current potential conductor 460 does not include a bent portion.

The positive-side connection conductor 471 and the negative-side connection conductor 472 are arranged on the same plane below (on the Z2 side of) the leg 453 of the intermediate potential conductor 450. Furthermore, the positive-side connection conductor 471 and the negative-side connection conductor 472 are arranged above (on the Z1 side of) the alternating current potential conductor 460. That is, the leg 441b of the positive electrode potential conductor 441, the legs 442b of the negative electrode potential conductor 442, the second portion 451b of the first standing wall 451, and the second portion 452b of the second standing wall 452 (arranged on the same plane), the leg 453 of the intermediate potential conductor 450, the positive-side connection conductor 471 and the negative-side connection conductor 472 (arranged on the same plane), and the alternating current potential conductor 460 are stacked in this order with insulating members (not shown) interposed therebetween.

Figure 22:
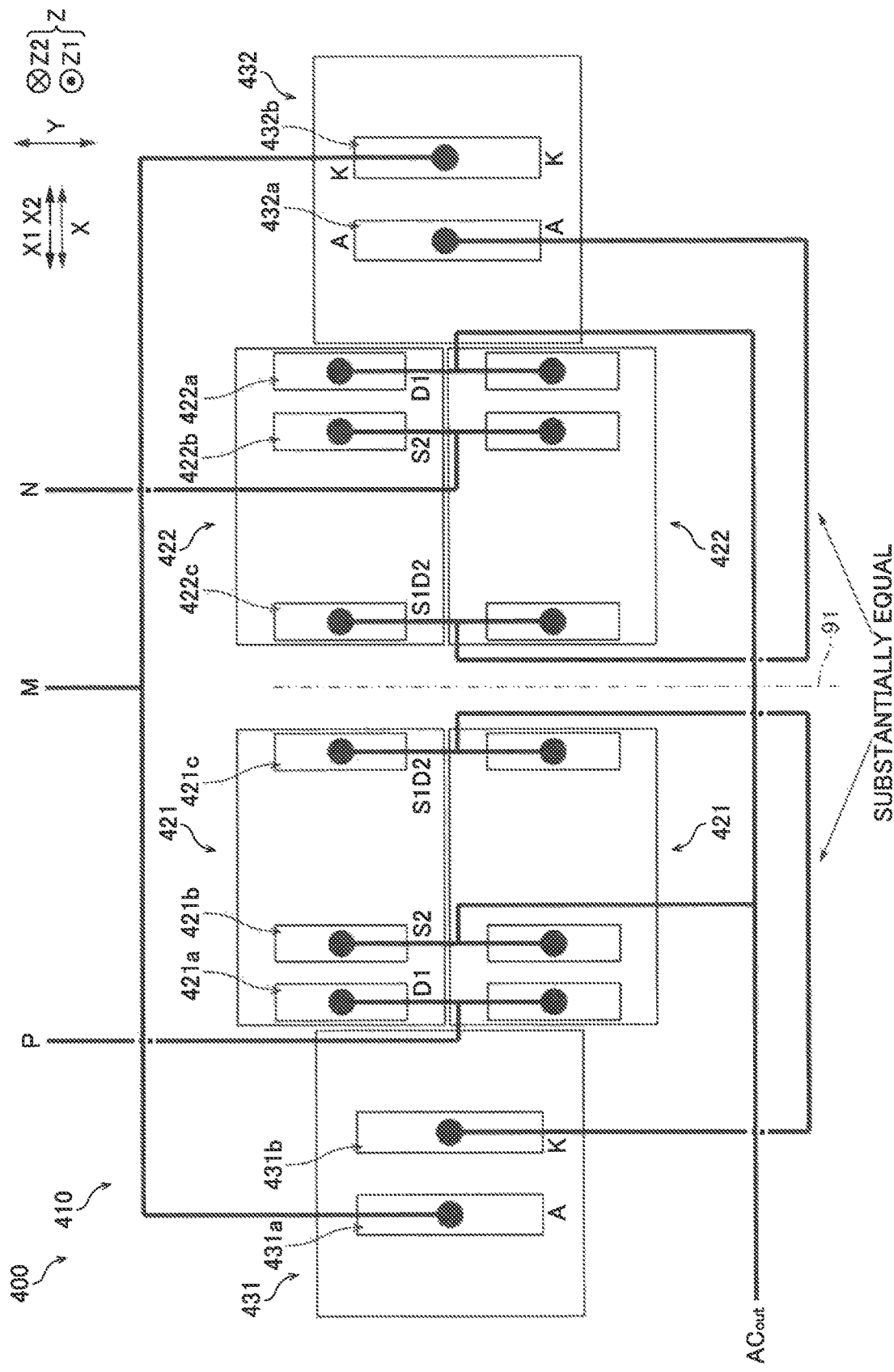
FIG. 22 is a schematic view for illustrating the lengths of wires that connect switching modules to diode modules of the power conversion device according to the fourth embodiment.

As shown in FIG. 22, in the power converter 410, similarly to the first embodiment, the length of a wire that connects the output terminals 421c of the first switching modules 421 to the cathode terminals 431b of the first diode module 431 is substantially equal to the length of a wire that connects the output terminals 422c of the second switching modules 422 to the anode terminals 432a of the second diode module 432.

The remaining configurations of the fourth embodiment are similar to those of the first embodiment.

The advantageous effects of the fourth embodiment are similar to those of the first embodiment.

Fifth Embodiment

A fifth embodiment is now described with reference to FIGS. 23 and 24. In this fifth embodiment, the arrangement of first switching modules 521 and a first diode module 531 in an X direction and the arrangement of a second diode module 532 and second switching modules 522 in the X direction are opposite to those of the first embodiment. In the figures, the same configurations as those of the first embodiment are denoted by the same reference numerals.

Figure 23:
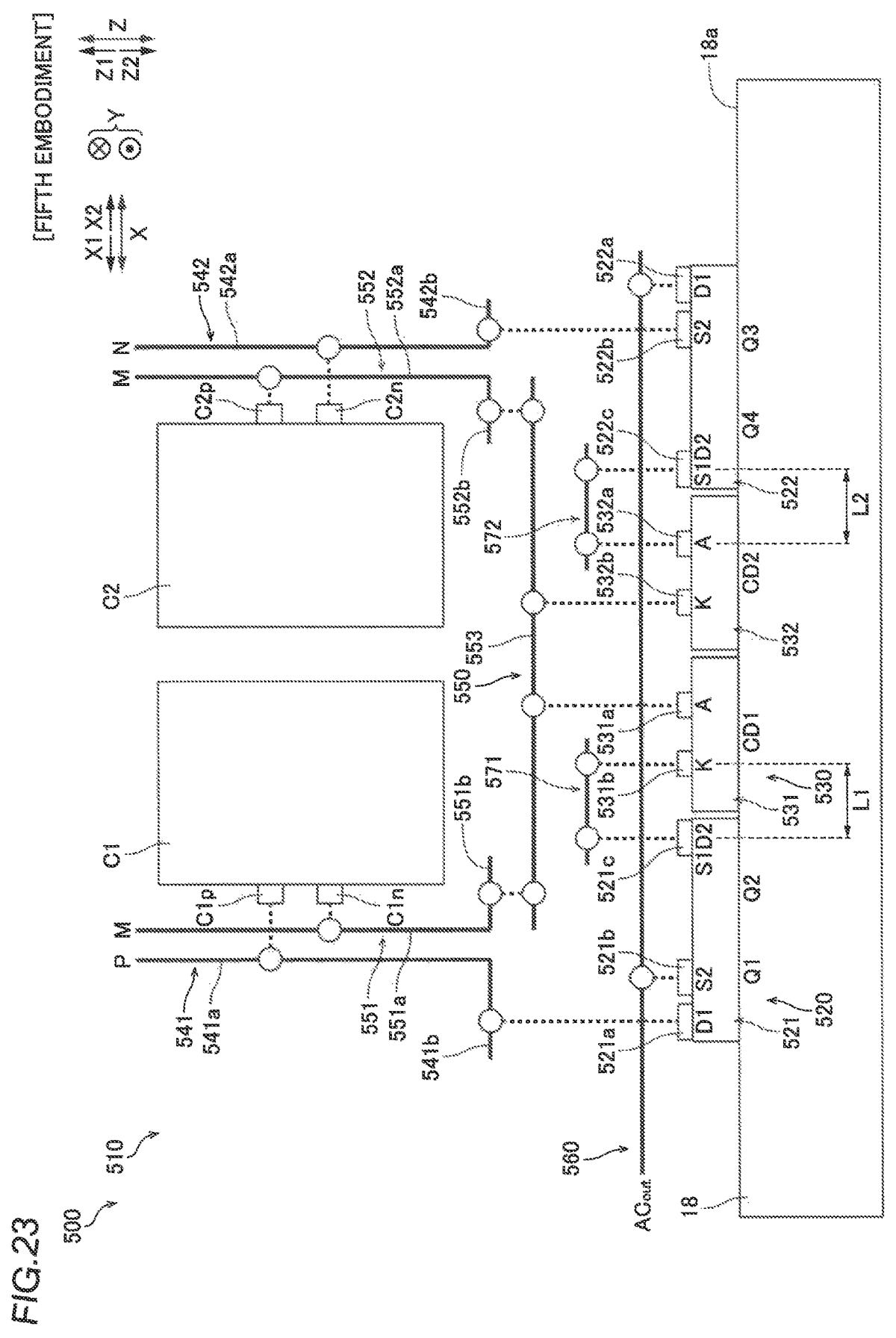

As shown in FIG. 23, a power conversion device 500 according to the fifth embodiment of the present invention includes a power converter 510. The power converter 510 includes two switching modules 520 (the first switching module 521 and the second switching module 522) and two diode modules 530 (the first diode module 531 and the second diode module 532).

The first switching modules 521 each include positive-side terminals 521a, negative-side terminals 521b, and output terminals 521c as external connection terminals for a module. The second switching modules 522 each include positive-side terminals 522a, negative-side terminals 522b, and output terminals 522c as external connection terminals for a module. The first diode module 531 includes anode terminals 531a and cathode terminals 531b as external connection terminals for a module. The second diode module 532 includes anode terminals 532a and cathode terminals 532b as external connection terminals for a module.

In the fifth embodiment, the first switching modules 521, the first diode module 531, the second diode module 532, and the second switching modules 522 are aligned in this order from the X1 side toward the X2 side in the X direction. Note that the first switching modules 521, the first diode module 531, the second diode module 532, and the second switching modules 522 are arranged close to the module(s) adjacent in the X direction.

In the fifth embodiment, unlike the first embodiment, the output terminals 521c, the negative-side terminals 521b, and the positive-side terminals 521a of the first switching modules 521 are aligned in this order from the X2 side toward the X1 side in the X direction. The output terminals 522c, the negative-side terminals 522b, and the positive-side terminals 522a of the second switching modules 522 are aligned in this order from the X1 side toward the X2 side in the X direction. That is, in the fifth embodiment, the terminal arrangement (the order of the positive-side terminals 521a, the negative-side terminals 521b, and the output terminals 521c) of the first switching modules 521 in the X direction is opposite to that of the first embodiment. Furthermore, the terminal arrangement (the order of the positive-side terminals 522a, the negative-side terminals 522b, and the output terminals 522c) of the second switching modules 522 in the X direction is opposite to that of the first embodiment.

In the fifth embodiment, similarly to the first embodiment, a distance L1 between the output terminals 521c of the first switching modules 521 and the cathode terminals 531b of the first diode module 531 in the X direction is substantially equal to a distance L2 between the output terminals 522c of the second switching modules 522 and the anode terminals 532a of the second diode module 532 in the X direction.

In the fifth embodiment, unlike the first embodiment, the anode terminals 531a and the cathode terminals 531b of the first diode module 531 are aligned in this order from the X2 side toward the X1 side in the X direction. Furthermore, the cathode terminals 532b and the anode terminals 532a of the second diode module 532 are aligned in this order from the X1 side toward the X2 side in the X direction. That is, in the fifth embodiment, the terminal arrangement (the order of the anode terminals 531a and the cathode terminals 531b) of the first diode module 531 in the X direction is opposite to that of the first embodiment. Furthermore, the terminal arrangement (the order of the anode terminals 532a and the cathode terminals 532b) of the second diode module 532 in the X direction is opposite to that of the first embodiment.

The power converter 510 includes a positive electrode potential conductor 541, a negative electrode potential conductor 542, an intermediate potential conductor 550, an alternating current potential conductor 560, a positive-side connection conductor 571, and a negative-side connection conductor 572.

The positive electrode potential conductor 541 includes a standing wall 541a and a leg 541b. The leg 541b extends in an X1 direction from the lower (Z2 side) end of the standing wall 541a. The standing wall 541a of the positive electrode potential conductor 541 is arranged on the X1 side of a first capacitor C1.

The negative electrode potential conductor 542 includes a standing wall 542a and a leg 542b. The leg 542b extends in an X2 direction from the lower (Z2 side) end of the standing wall 542a. The standing wall 542a of the negative electrode potential conductor 542 is arranged on the X2 side of a second capacitor C2.

The intermediate potential conductor 550 includes a first standing wall 551. The first standing wall 551 includes a first portion 551a that extends in a Z direction and a second portion 551b that extends in the X direction. The second portion 551b extends in the X1 direction from the lower (Z2 side) end of the first portion 551a. In the fifth embodiment, similarly to the first embodiment, the first standing wall 551 is adjacent to the standing wall 541a of the positive electrode potential conductor 541. Specifically, the first portion 551a of the first standing wall 551 faces the standing wall 541a of the positive electrode potential conductor 541 in the X direction in the vicinity of the X1 side of the standing wall 541a of the positive electrode potential conductor 541. Note that the second portion 551b of the first standing wall 551 is configured (arranged on the same plane) in such a manner that its position (height position) in the Z direction is substantially the same as that of the leg 541b of the positive electrode potential conductor 541.

The intermediate potential conductor 550 includes a second standing wall 552 that extends in the Z direction. The second standing wall 552 includes a first portion 552a that extends in the Z direction and a second portion 552b that extends in the X direction. The second portion 552b extends in the X1 direction from the lower (Z2 side) end of the first portion 552a. In the fifth embodiment, similarly to the first embodiment, the second standing wall 552 is adjacent to the standing wall 542a of the negative electrode potential conductor 542. Specifically, the first portion 552a of the second standing wall 552 faces the standing wall 542a of the negative electrode potential conductor 542 in the X direction in the vicinity of the X1 side of the standing wall 542a of the negative electrode potential conductor 542. Note that the second portion 552b of the second standing wall 552 is configured (arranged on the same plane) in such a manner that its position (height position) in the Z direction is substantially the same as that of the leg 542b of the negative electrode potential conductor 542. The second portion 552b of the second standing wall 552 and the leg 542b of the negative electrode potential conductor 542 are arranged on the same plane as the second portion 551b of the first standing wall 551 and the leg 541b of the positive electrode potential conductor 541.

The intermediate potential conductor 550 includes a leg 553 that extends in the X direction. The leg 553 is arranged below (on the Z2 sides of) the second portion 551b of the first standing wall 551 and the second portion 552b of the second standing wall 552. Similarly to the first embodiment, the leg 553 is fixed in contact with the second portion 551b of the first standing wall 551 in the Z direction. Furthermore, the leg 553 is fixed in contact with the second portion 552b of the second standing wall 552 in the Z direction.

The alternating current potential conductor 560 is arranged below (on the Z2 sides of) the positive-side connection conductor 571 and the negative-side connection conductor 572. Furthermore, the alternating current potential conductor 560 is arranged above (on the Z1 sides of) the first switching modules 521, the first diode module 531, the second diode module 532, and the second switching modules 522.

The alternating current potential conductor 560 is configured in such a manner that its end on the X1 side is located on the X1 side of the positive-side terminals 521a of the first switching modules 521 in the X direction. Furthermore, the alternating current potential conductor 560 is configured in such a manner that its end on the X2 side is located in the vicinity of the upper sides (Z1 sides) of the positive-side terminals 522a of the second switching modules 522 in the X direction. Unlike the alternating current potential conductor 60 according to the first embodiment, the alternating current potential conductor 560 is configured (arranged on the same plane) in such a manner that its position (height position) in the Z direction is substantially the same from its end on the X1 side to its end on the X2 side. That is, in the power converter 510, the alternating current potential conductor 560 does not include a bent portion.

The positive-side connection conductor 571 and the negative-side connection conductor 572 are arranged on the same plane below (on the Z2 side of) the leg 553 of the intermediate potential conductor 550. The positive-side connection conductor 571 and the negative-side connection conductor 572 are arranged above (on the Z1 side of) the alternating current potential conductor 560. That is, the leg 553 of the intermediate potential conductor 550, the positive-side connection conductor 571 and the negative-side connection conductor 572, and the alternating current potential conductor 560 are stacked in this order with insulating members (not shown) interposed therebetween.

Figure 24:
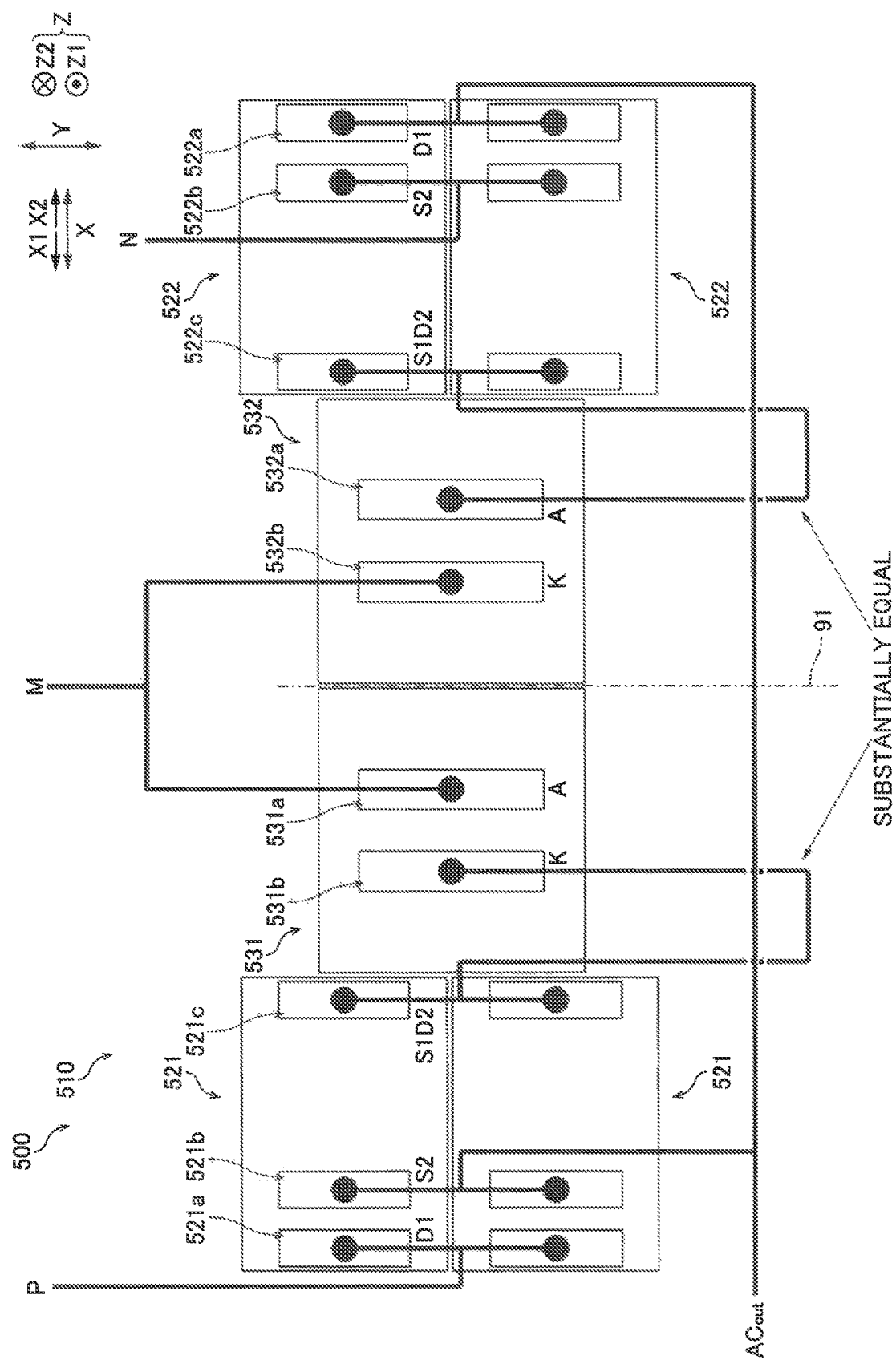
FIG. 24 is a schematic view for illustrating the lengths of wires that connect switching modules to diode modules of the power conversion device according to the fifth embodiment.

As shown in FIG. 24, in the power converter 510, similarly to the first embodiment, the length of a wire that connects the output terminals 521c of the first switching modules 521 to the cathode terminals 531b of the first diode module 531 is substantially equal to the length of a wire that connects the output terminals 522c of the second switching modules 522 to the anode terminals 532a of the second diode module 532.

The remaining configurations of the fifth embodiment are similar to those of the first embodiment.

Advantageous Effects of Fifth Embodiment

According to the fifth embodiment, the following advantageous effects are achieved.

According to the fifth embodiment, as described above, the first switching modules 521, the first diode module 531, the second diode module 532, and the second switching modules 522 are aligned in this order in the X direction. Accordingly, the switching modules 520 including the terminals at their ends on a first side in the X direction and their ends on a second side in the X direction are not adjacent to each other, and thus it is not necessary to space the switching modules 520 apart from each other in the X direction in order to ensure an insulation distance, unlike the case in which the switching modules 520 are adjacent to each other. Consequently, as compared with the case in which the switching modules 520 are adjacent to each other, the modules can be arranged closer to each other, and thus the power conversion device 500 can be downsized.

The remaining advantageous effects of the fifth embodiment are similar to those of the first embodiment.

Modified Examples

The embodiments disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the first switching modules 21 (321, 421, 521) and the second switching modules 22 (322, 422, 522) include substantially the same package in each of the aforementioned first to fifth embodiments, the present invention is not restricted to this. In the present invention, the first switching modules and the second switching modules may alternatively include different packages.

While the first diode module 31 (331, 431, 531) and the second diode module 32 (332, 432, 532) include substantially the same package in each of the aforementioned first to fifth embodiments, the present invention is not restricted to this. In the present invention, the first diode module and the second diode module may alternatively include different packages.

While the positive-side terminals 21a (321a, 421a, 521a), the negative-side terminals 21b (321b, 421b, 521b), and the output terminals 21c (321c, 42c 1, 521c) of the first switching modules 21 (321, 421, 521) and the positive-side terminals 22a (322a, 422a, 522a), the negative-side terminals 22b (322b, 422b, 522b), and the output terminals 22c (322c, 422c, 522c) of the second switching modules 22 (322, 422, 522) are arranged in such a manner as to be substantially symmetric with respect to the centerline 91 in each of the aforementioned first to fifth embodiments, the present invention is not restricted to this. In the present invention, the positive-side terminals and the negative-side terminals of the first switching modules and the positive-side terminals and the negative-side terminals of the second switching modules may not be arranged in such a manner as to be substantially symmetric with respect to the centerline, but the output terminals of the first switching modules and the output terminals of the second switching modules may alternatively be arranged in such a manner as to be substantially symmetric with respect to the centerline.

While the cathode terminals 31b (331b, 431b, 531b) and the anode terminals 31a (331a, 431a, 531a) of the first diode module 31 (331, 431, 531) and the anode terminals 32a (332a, 432a, 532a) and the cathode terminals 32b (332b, 432b, 532b) of the second diode module 32 (332, 432, 532) are arranged in such a manner as to be substantially symmetric with respect to the centerline 91 in each of the aforementioned first to fifth embodiments, the present invention is not restricted to this. In the present invention, the anode terminals of the first diode module and the cathode terminals of the second diode module may not be arranged in such a manner as to be substantially symmetric with respect to the centerline, but the cathode terminals of the first diode module and the anode terminals of the second diode module may alternatively be arranged in such a manner as to be substantially symmetric with respect to the centerline.

While in each of the first switching modules 21 (321, 421, 521) and the second switching modules 22 (322, 422, 522), at least any two of the positive-side terminals 20a, the negative-side terminals 20b, and the output terminals 20c are respectively arranged at the end 20d on one side in the X direction and the end 20e on the other side in the X direction in each of the aforementioned first to fifth embodiments, the present invention is not restricted to this. In the present invention, in each of the first switching modules and the second switching modules, none of the positive-side terminals, the negative-side terminals, and the output terminals may alternatively be arranged at one of the end on one side in the X direction and the end on the other side in the X direction.

While in each of the first diode module 31 (331, 431, 531) and the second diode module 32 (332, 432, 532), the anode terminals 30a and the cathode terminals 30b are arranged in the central portion 30c in the X direction in each of the aforementioned first to fifth embodiments, the present invention is not restricted to this. In the present invention, in each of the first diode module and the second diode module, at least one of the anode terminals or the cathode terminals may alternatively be arranged at an end on one side in the X direction or an end on the other side in the X direction.

While the alternating current potential conductor 60 includes the bent portion 60a that is bent in such a manner as to be spaced apart from the region R in which the control boards 20g of the first switching modules 21 are arranged in the aforementioned first embodiment, the present invention is not restricted to this. In the present invention, the alternating current potential conductor may alternatively include a bent portion that is bent in such a manner as to be spaced apart from a region in which the control boards of the second switching modules are arranged. Furthermore, in the configurations (the arrangement of the modules or the terminal arrangement of the modules) according to the aforementioned third to fifth embodiments, the alternating current potential conductor may alternatively include a bent portion that is bent in such a manner as to be spaced apart from a region in which control boards of at least one of the first switching modules or the second switching modules are arranged.

Figure 25:
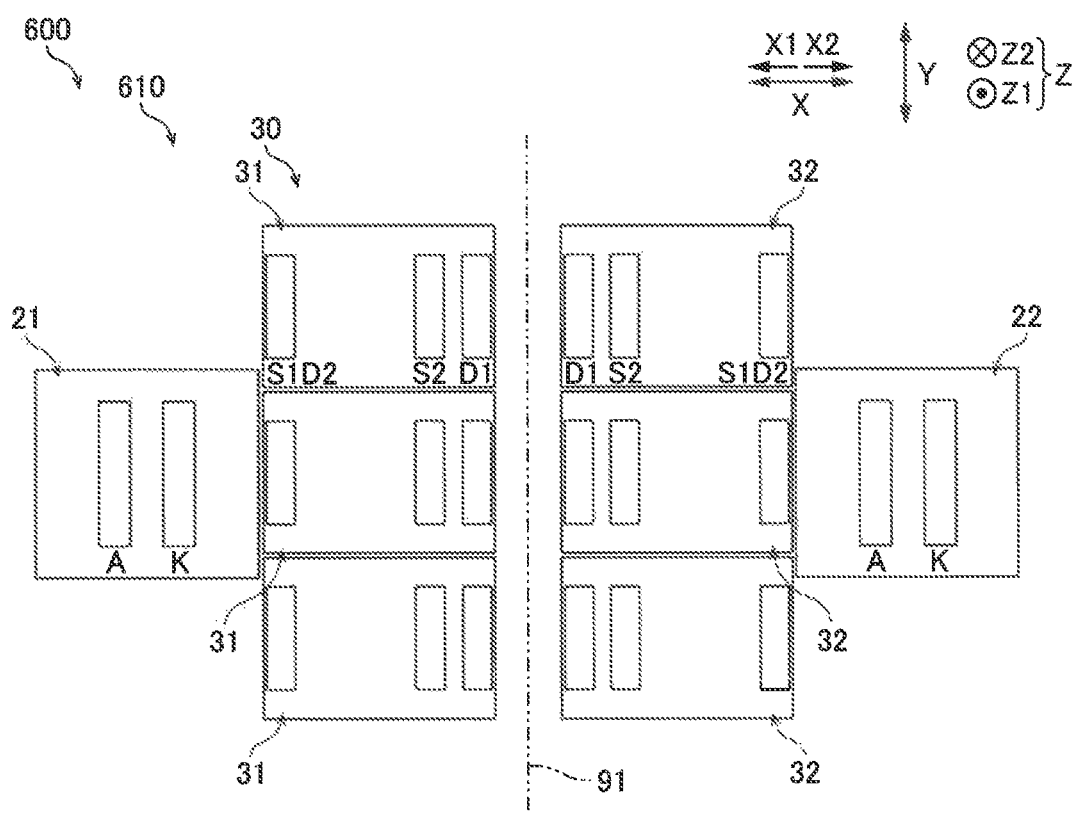
FIG. 25 is a top view showing an arrangement of switching modules and diode modules of a power conversion device according to a first modified example of the first embodiment.

While the two first switching modules 21 (321, 421, 521) are connected in parallel so as to be aligned in the Y direction, and the two second switching modules 22 (322, 422, 522) are connected in parallel so as to be aligned in the Y direction in each of the aforementioned first to fifth embodiments, the present invention is not restricted to this. In the present invention, as in a power converter 610 of a power conversion device 600 according to a first modified example shown in FIG. 25, three first switching modules may alternatively be connected in parallel so as to be aligned in a Y direction, and three second switching modules may alternatively be connected in parallel so as to be aligned in the Y direction. Alternatively, four or more first switching modules may be connected in parallel so as to be aligned in the Y direction, and four or more second switching modules may be connected in parallel so as to be aligned in the Y direction. Alternatively, one first switching module may be provided without being connected in parallel, and one second switching module may be provided without being connected in parallel. Note that a plurality of first diode modules may alternatively be connected in parallel so as to be aligned in the Y direction, and a plurality of second diode modules may alternatively be connected in parallel so as to be aligned in the Y direction.

While the semiconductor switching elements Q are configured as MOSFETs in each of the aforementioned first to fifth embodiments, the present invention is not restricted to this. In the present invention, as in a power conversion device 700 according to a second modified example shown in FIG. 26, semiconductor switching elements may alternatively be configured as insulated gate bipolar transistors (IGBTs).

As shown in FIG. 26, the power conversion device 700 includes a power converter 710. The power converter 710 includes four semiconductor switching elements Q (a first switching element Q701, a second switching element Q702, a third switching element Q703, and a fourth switching element Q704). The semiconductor switching elements Q are IGBTs made of silicon (Si) semiconductors. The power converter 710 includes two switching modules 720 (a first switching module 721 and a second switching module 722). The first switching element Q701 and the second switching element Q702 are incorporated in the first switching module 721. Furthermore, the third switching element Q703 and the fourth switching element Q704 are incorporated in the second switching module 722.

While the crosstie direction orthogonal to the traveling direction of the railroad vehicle 10 and the upward-downward direction of the railroad vehicle 10 are respectively defined as the Y direction and the Z direction in each of the aforementioned first to fifth embodiments, the present invention is not restricted to this. In the present invention, the crosstie direction orthogonal to the traveling direction of the railroad vehicle and the upward-downward direction of the railroad vehicle may alternatively be defined as the Z direction and the Y direction, respectively.

While the power conversion device 100 (200, 300, 400, 500) is configured as a power conversion device mounted on the railroad vehicle 10 in each of the aforementioned first to fifth embodiments, the present invention is not restricted to this. In the present invention, the power conversion device may alternatively be configured as a power conversion device mounted on equipment other than the railroad vehicle (used for equipment other than the railroad vehicle).

What is claimed is:

1. A power conversion device configured to output three different levels of power at upper, intermediate and lower potentials, the power conversion device comprising:
    a switching module including two semiconductor switching elements and including a positive-side terminal, a negative-side terminal, and an output terminal aligned in a first direction; and
    a diode module including a diode and including an anode terminal and a cathode terminal aligned in the first direction; wherein
    the switching module includes:
        a first switching module including the positive-side terminal as an upper potential terminal, the negative-side terminal, and the output terminal; and
        a second switching module including the negative-side terminal as a lower potential terminal, the positive-side terminal, and the output terminal;
    the diode module includes:
        a first diode module including the cathode terminal connected to the output terminal of the first switching module, and the anode terminal as an intermediate potential terminal; and
        a second diode module including the anode terminal connected to the output terminal of the second switching module, and the cathode terminal as an intermediate potential terminal;
    each of the first switching module, the second switching module, the first diode module and the second diode module consists of a package, respectively, and is aligned in the first direction; and
    a distance between the output terminal of the first switching module and the cathode terminal of the first diode module in the first direction is substantially equal to a distance between the output terminal of the second switching module and the anode terminal of the second diode module in the first direction.

2. The power conversion device according to claim 1, wherein the output terminal of the first switching module and the output terminal of the second switching module are arranged in such a manner as to be substantially symmetric with respect to a centerline along a second direction orthogonal to the first direction; and the cathode terminal of the first diode module and the anode terminal of the second diode module are arranged in such a manner as to be substantially symmetric with respect to the centerline.

3. The power conversion device according to claim 2, wherein
the positive-side terminal, the negative-side terminal, and the output terminal of the first switching module and the positive-side terminal, the negative-side terminal, and the output terminal of the second switching module are arranged in such a manner as to be substantially symmetric with respect to the centerline; and
the cathode terminal and the anode terminal of the first diode module and the anode terminal and the cathode terminal of the second diode module are arranged in such a manner as to be substantially symmetric with respect to the centerline.

4. The power conversion device according to claim 2, wherein
the first switching module and the second switching module include substantially a same package, and are arranged in such a manner as to be substantially symmetric with respect to the centerline; and
the first diode module and the second diode module include substantially a same package, and are arranged in such a manner as to be substantially symmetric with respect to the centerline.

5. The power conversion device according to claim 2, wherein
each of the first switching module and the second switching module is arranged such that at least any two of the positive-side terminal, the negative-side terminal, and the output terminal are arranged at a first side end in the first direction and at a second side end in the first direction, respectively; and
each of the first diode module and the second diode module is arranged such that the anode terminal and the cathode terminal are arranged in a central portion in the first direction.

6. The power conversion device according to claim 5, wherein
the first diode module, the first switching module, the second switching module, and the second diode module are aligned in this order in the first direction; and
the first switching module and the second switching module are spaced apart from each other in the first direction such that a shortest distance between one of the positive-side terminal, the negative-side terminal, and the output terminal of the first switching module and one of the positive-side terminal, the negative-side terminal, and the output terminal of the second switching module is equal to or longer than a predetermined insulation distance.

7. The power conversion device according to claim 2, further comprising:
a first capacitor and a second capacitor connected in series with each other;
a positive electrode potential conductor connected to a positive electrode terminal of the first capacitor and the positive-side terminal of the first switching module;
a negative electrode potential conductor connected to a negative electrode terminal of the second capacitor and the negative-side terminal of the second switching module; and
an intermediate potential conductor connected to a negative electrode terminal of the first capacitor, a positive electrode terminal of the second capacitor, the anode terminal of the first diode module, and the cathode terminal of the second diode module; wherein
each of the positive electrode potential conductor and the negative electrode potential conductor includes a standing wall extending in a third direction orthogonal to the first direction and the second direction; and
the intermediate potential conductor includes a first standing wall and a second standing wall extending in the third direction so as to be adjacent to the standing wall of each of the positive electrode potential conductor and the negative electrode potential conductor.

8. The power conversion device according to claim 7, wherein
each of the positive electrode potential conductor and the negative electrode potential conductor further includes a leg extending in the first direction; and
the intermediate potential conductor further includes a leg extending in the first direction so as to be adjacent in the third direction to the leg of each of the positive electrode potential conductor and the negative electrode potential conductor.

9. The power conversion device according to claim 2, further comprising an alternating current potential conductor connected to the negative-side terminal of the first switching module and the positive-side terminal of the second switching module, the alternating current potential conductor extending in the first direction; wherein
the alternating current potential conductor includes a bent portion that is bent to be spaced apart from a region in which a control board of at least one of the first switching module or the second switching module is arranged.

10. The power conversion device according to claim 2, wherein
a plurality of first switching modules and
a plurality of second switching modules are arranged respectively in parallel to each other so as to be aligned in the second direction.

11. The power conversion device according to claim 1, wherein
the power conversion device is a power conversion device mounted on a railroad vehicle; and
the first switching module, the second switching module, the first diode module, and the second diode module are aligned in the first direction, which is a traveling direction of the railroad vehicle.

12. The power conversion device according to claim 1, wherein the package of the first switching module and the package of the second switching module are aligned in the first direction and connected together, and the package of the first diode module and the package of the second diode module are aligned in the first direction, are connected together, and are disposed outside and along the packages of the first and second switching modules.

* * * * *